(12) United States Patent
Nishino et al.

(10) Patent No.: US 7,220,922 B2
(45) Date of Patent: May 22, 2007

(54) ELECTRONIC COMPONENT, COMPONENT MOUNTING EQUIPMENT, AND COMPONENT MOUNTING METHOD

(75) Inventors: Kenichi Nishino, Osaka (JP); Shinji Kanayama, Kashihara (JP); Shinjiro Tsuji, Nara (JP); Masayuki Ida, Moriguchi (JP); Tomotaka Nishimoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 349 days.

(21) Appl. No.: 10/399,915

(22) PCT Filed: Oct. 23, 2001

(86) PCT No.: PCT/JP01/09265

§ 371 (c)(1),
(2), (4) Date: Sep. 30, 2003

(87) PCT Pub. No.: WO02/35903

PCT Pub. Date: May 2, 2002

(65) Prior Publication Data

US 2004/0060666 A1 Apr. 1, 2004

(30) Foreign Application Priority Data

Oct. 26, 2000 (JP) ............................. 2000-326891

(51) Int. Cl.
*H01R 12/04* (2006.01)
*H05K 1/11* (2006.01)

(52) U.S. Cl. .................... 174/261; 174/260; 29/840

(58) Field of Classification Search ........ 361/749–751, 361/783, 792; 156/292, 145, 285, 382; 29/740, 29/721, 739, 830–846; 349/187, 190
See application file for complete search history.

(56) References Cited

U.S. PATENT DOCUMENTS

| | | | | |
|---|---|---|---|---|
| 4,127,432 A | * | 11/1978 | Kuwano et al. | ............ 156/297 |
| 4,292,116 A | * | 9/1981 | Takahashi et al. | .......... 156/566 |
| 4,381,601 A | * | 5/1983 | Tamai et al. | ................... 29/740 |
| 4,386,464 A | * | 6/1983 | Yanai et al. | ................... 29/834 |
| 4,881,319 A | * | 11/1989 | Yagi et al. | ..................... 29/840 |
| 4,951,388 A | * | 8/1990 | Eguchi et al. | ................. 29/832 |
| 5,111,363 A | | 5/1992 | Yagi et al. | |
| 5,501,005 A | * | 3/1996 | Onitsuka | ...................... 29/833 |
| 5,575,059 A | | 11/1996 | Muraoka et al. | |
| 5,639,009 A | | 6/1997 | Abe | |

(Continued)

FOREIGN PATENT DOCUMENTS

JP 6-43472 2/1994

(Continued)

*Primary Examiner*—Tuan Dinh
(74) *Attorney, Agent, or Firm*—Wenderoth, Lind & Ponack, L.L.P.

(57) ABSTRACT

Component mounting equipment mounts an FPC board onto an LCD board. The LCD board has a first electrode section on one side edge and a second electrode section on another side edge. The FPC board has a first section on one side edge and a second section on another side edge. A first mounting apparatus mounts the first section on the first electrode section. A second mounting apparatus mounts the second section on the second electrode section. In the second component mounting apparatus, the second section is separated from the second electrode section at an ACF supply section and released at a pre-press bonding section.

20 Claims, 24 Drawing Sheets

U.S. PATENT DOCUMENTS

| | | |
|---|---|---|
| 5,737,053 A | 4/1998 | Yomogihara et al. |
| 5,778,525 A * | 7/1998 | Hata et al. .................... 29/836 |
| 6,266,869 B1 * | 7/2001 | Tracy et al. .................. 29/740 |
| 6,544,377 B1 * | 4/2003 | Minamitani et al. ........ 156/299 |
| 6,605,315 B1 * | 8/2003 | Ozono et al. ............... 438/118 |
| 6,618,937 B2 * | 9/2003 | Onitsuka ..................... 29/832 |
| 6,643,921 B2 * | 11/2003 | Asai et al. .................... 29/833 |

FOREIGN PATENT DOCUMENTS

| | | |
|---|---|---|
| JP | 9-101536 | 4/1997 |
| JP | 9-127540 | 5/1997 |
| JP | 2000-171819 | 6/2000 |
| JP | 2001-230278 | 8/2001 |

\* cited by examiner

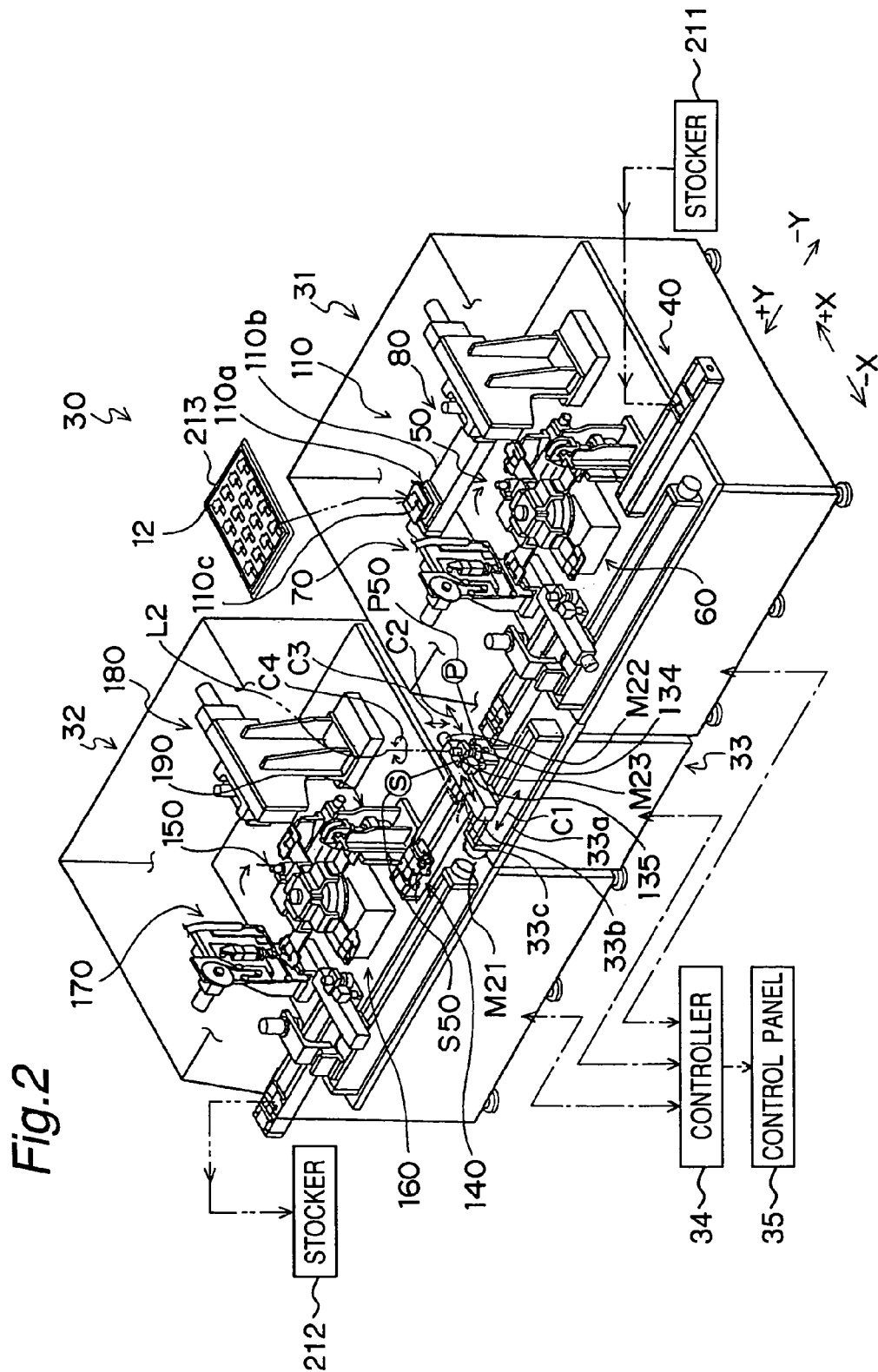

ELECTRONIC COMPONENT, COMPONENT MOUNTING EQUIPMENT, AND COMPONENT MOUNTING METHOD

TECHNICAL FIELD

The present invention relates to an electronic component having a flexible printed-circuit board (FPC board) mounted onto a liquid crystal display board (LCD board). The invention also relates to component mounting equipment and a method for mounting flexible film-like components including the FPC board onto plate-like components including the LCD board.

BACKGROUND ART

FIGS. 30A and 30B show an example of a small LCD board 1 suitable for equipment such as mobile phones. The LCD board 1 has a liquid crystal display section 1a and an electrode section 1b having ends of driver voltage supply lines 2 disposed along one side edge of the board. On an FPC board 3 that is mounted on the LCD board 1, a driver circuit is formed by an IC 4, chip components 5 and the like. One side edge of the FPC board 3 is provided with a electrode section 3a in which ends of driver voltage supply lines 7 for the driver circuit are disposed. The electrode section 3a is fixed onto the electrode section 1b of the LCD board 1 with anisotropic conductive film tape (ACF tape), anisotropic conductive paste (ACP) or the like, and the driver voltage supply lines 2 of the LCD board 1 are electrically connected to corresponding driver voltage supply lines 7 of the FPC board 3.

In recent years, a function of displaying a color image has been required for this type of LCD board 1 and, accordingly, a conspicuous increase in a number of the driver voltage supply lines 2, 7 has been demanded. A decrease in a pitch of the driver voltage supply lines 2, 7 would allow the number of the driver voltage supply lines 2, 7 to be increased without causing increases in sizes of the LCD board 1 and the FPC board 3. However, since the decrease in pitch is limited to the order of 50 µm, it is difficult to achieve the increase in the number of the driver voltage supply lines 2, 7 required for displaying the color image and the like only by the decrease in the pitch.

For example, if the LCD board 1 has a quadrangular shape with a length of a side of about 30 mm, the pitch of the driver voltage supply lines 2, 7 is about 50 µm, and the number of the driver voltage supply lines 2 is about 768 at a maximum, then a length required for achievement of the number of the driver voltage supply lines 2 is 38.4 mm (50 (µm) multiplied by 768 (lines)), which is larger than the length of a side of the LCD board 1 and cannot be fulfilled.

SUMMARY OF THE INVENTION

Accordingly, a first object of the present invention is to increase a number of driver voltage supply lines in an electronic component having an FPC board mounted onto an LCD board without causing increase in sizes of the LCD board and the FPC board. A second object of the invention is to provide component mounting equipment and a method suitable for producing such an electronic component.

In order to achieve the first object, a first aspect of the invention provides an electronic component comprising a display board and a flexible printed-circuit board on which a driver circuit for the display board is formed. The display board has a display section, a first electrode section in which ends of a plurality of driver voltage supply lines are disposed on one side edge extending in a first direction, and a second electrode section in which ends of a plurality of driver voltage supply lines are disposed on another side edge extending in a second direction. The first direction and the second direction cross each other at a predetermined angle. The flexible printed-circuit board has a first section in which ends of a plurality of driver voltage supply lines are disposed on one side edge extending in the first direction and which is placed onto the first electrode section of the display board, and a second section in which ends of a plurality of driver voltage supply lines are disposed on another side edge extending in the second direction and which is placed onto the second electrode section of the display board.

In the electronic component of the first aspect of the invention, the first and second sections of the flexible printed-circuit board (FPC board), which are provided on two side edges extending in the first and the second directions crossing each other at the predetermined angle, are placed onto the first and the second electrode sections of the display board which are provided on two side edges extending similarly in the first and the second directions. In other words, the ends of the driver voltage supply lines are arranged in the first and the second electrode sections provided on different side edges of the display board, and therefore the number of the driver voltage supply lines can be increased without causing increase in sizes of the display board and the FPC board.

It is preferable that the flexible printed-circuit board further comprises a cut-out hole at a connection between the first section and the second section.

Provision of the cut-out hole allows the flexible printed-circuit board to be bent so that the first and the second sections move relatively with respect to each other. In mounting of the FPC board onto the display board, therefore, the first and second sections of the flexible board can be easily and reliably placed onto the first and second electrode sections of the display board.

A second aspect of the invention provides a flexible printed-circuit board on which a driver circuit for a display board is formed, comprising: a first section in which ends of a plurality of driver voltage supply lines are disposed on one side edge extending in a first direction; and a second section in which ends of a plurality of driver voltage supply lines are disposed on another side edge extending in a second direction, with the first direction and the second direction crossing each other at a predetermined angle.

In order to achieve the second object, a third aspect of the invention provides component mounting equipment for mounting a film-like component onto a plate-like component, with the plate-like component having a first placement section which is provided on one side edge and a second placement section which is provided on another side edge, and with the film-like component having a first section to be placed, which is provided on one side edge, and a second section to be placed, which is provided on another side edge, comprising: a first mounting apparatus for placing the first section of the film-like component onto the first placement section of the plate-like component; and a second mounting apparatus for placing the second section of the film-like component onto the second placement section of the plate-like component.

To be more specific, the first mounting apparatus comprises: an adhesive supply section for supplying adhesive to the first placement section of the plate-like component; a pre-press bonding section for aligning the first section of the film-like component with the first placement section of the plate-like component, and pressing the first section onto the first placement section with a first pressing force; a final press bonding section for pressing the first section of the film-like component onto the first placement section of the plate-like component with a second pressing force, thereby fixing the first section of the film-like component onto the first placement section of the plate-like component; a transfer section for holding the plate-like component, and transferring the plate-like component sequentially to the adhesive supply section, the pre-press bonding section, and the final press bonding section; and a film-like component supply section for supplying the film-like component to the pre-press bonding section.

It is preferable that the transfer section comprises stages each provided with a recess where the plate-like component is to be loaded, wherein the pre-press bonding section comprises a pre-press bonding head that has a first portion for holding a portion of the film-like component including the first section and a second portion for holding a portion of the film-like component including the second section, and that presses the first section of the film-like component onto the first placement section of the plate-like component loaded on an index stage, and wherein a depth of the recess of the stage is set so that a clearance larger than a thickness of the film-like component is made between the stage and the second portion of the pre-press bonding head when the first portion of the pre-press bonding head is pressing the first section of the film-like component onto the first placement section of the plate-like component.

With such a setting of the depth of the recess of the stage, interference between the pre-press bonding head and the stage is prevented when the first section of the film-like component is pre-press bonded onto the first placement section of the plate-like component in the pre-press bonding section, resulting in that a reliable pre-press bonding process can be performed.

The second mounting apparatus comprises: an adhesive supply section for supplying adhesive onto the second placement section of the plate-like component; a pre-press bonding section for aligning the second section of the film-like component with the second placement section of the plate-like component, and pressing the second section onto the second placement section; a final press bonding section for pressing the second section of the film-like component onto the second placement section of the plate-like component with a second pressing force, thereby fixing the second section of the film-like component onto the second placement section of the plate-like component; and a transfer section for transferring the plate-like component and the film-like component of which the first section has been fixed onto the first placement section of the plate-like component sequentially to the adhesive supply section, the pre-press bonding section, and the final press bonding section, wherein the transfer section comprises a first holding mechanism for holding the plate-like component, a second holding mechanism for holding the portion of the film-like component including the first section, and a third holding mechanism for holding the portion of the film-like component including the second section, and wherein the third holding mechanism holds the film-like component with the second section separated from the second placement section of the plate-like component in the adhesive supply section, and releases the second section of the film-like component in the pre-press bonding section.

The second mounting machine is capable of performing reliably and smoothly application of adhesive and the pre-press bonding operation, because the film-like component is held with the second section separated from the second placement section of the plate-like component in the adhesive supply section and the second section of the film-like component is released in the pre-press bonding section, as described above.

To be more specific, the pre-press bonding section of the second mounting apparatus comprises: a recognition section for recognizing the plate-like component and the film-like component; and an alignment head for holding the second section of the film-like component, and moving the second section of the film-like component on a basis of recognition by the recognition section, thereby aligning the second section with the second placement section of the plate-like component.

Furthermore specifically, the second mounting apparatus further comprises a carry-in section for supplying to the transfer section the plate-like component and the film-like component of which the first section has been fixed onto the first placement section of the plate-like component. The carry-in section deforms the film-like component so that the second section is separated from the second placement section of the plate-like component, and supplies the plate-like component and the film-like component to the transfer section while retaining deformation of the film-like component.

The component mounting equipment preferably comprises a transporting apparatus that connects the first mounting apparatus and the second mounting apparatus, and that transports from the first mounting apparatus to the second mounting apparatus the plate-like component and the film-like component of which the first section has been fixed onto the first placement section of the plate-like component by the first mounting apparatus. The plate-like component and the film-like component may be transported from the first mounting apparatus to the second mounting apparatus by manual operation or other transfer apparatus without provision of the transporting apparatus.

For example, the plate-like component is a liquid crystal display board, and the film-like component is a flexible printed-circuit board on which a driver circuit for the liquid crystal display board is formed. However, the plate-like component is not limited to the liquid crystal display board but may be, for example, an electroluminescence device (EL device), a plasma display panel (PDP), a conventional printed board or the like. The film-like component is not limited to the flexible printed-circuit board but may be, for example, a tape carrier package (TCP) or the like.

A fourth aspect of the invention provides a mounting apparatus for mounting a film-like component onto a plate-like component, with the plate-like component having a first placement section provided on one side edge and a second placement section provided on another side edge, and with the film-like component having a first section to be fixed provided on one side edge and a second section to be fixed provided on another side edge, comprising: an adhesive supply section for supplying adhesive to the first placement section of the plate-like component; a pre-press bonding section for aligning the first section of the film-like component with the first placement section of the plate-like component, and pressing the first section onto the first placement section with a first pressing force; a final press bonding section for pressing the first section of the film-like component onto the first placement section of the plate-like component with a second pressing force, thereby fixing the first section of the film-like component to the first placement section of the plate-like component; a transfer section for holding the plate-like component, and transferring the plate-like component sequentially to the adhesive supply section, the pre-press bonding section, and the final press bonding section; and a film-like component supply section for supplying the film-like component to the pre-press bonding section.

A fifth aspect of the invention provides a mounting apparatus for mounting a film-like component onto a plate-like component, with the plate-like component having a first placement section provided on one side edge and a second placement section provided on another side edge, and with the film-like component having a first section to be fixed provided on one side edge and a second section to be fixed provided on another side edge, comprising: an adhesive supply section for supplying adhesive onto the second placement section of the plate-like component; a pre-press bonding section for aligning the second section of the film-like component with the second placement section of the plate-like component, and pressing the second section onto the second placement section with a first pressing force; a final press bonding section for pressing the second section of the film-like component onto the second placement section of the plate-like component with a second pressing force, thereby fixing the second section of the film-like component onto the second placement section of the plate-like component; and a transfer section for transferring the plate-like component and the film-like component of which the first section has been fixed to the first placement section of the plate-like component sequentially to the adhesive supply section, the pre-press bonding section, and the final press bonding section, wherein the transfer section has a first holding mechanism for holding the plate-like component, a second holding mechanism for holding a portion of the film-like component including the first section, and a third holding mechanism for holding a portion of the film-like component including the second section, and wherein the third holding mechanism holds the film-like component with the second section separated from the second placement section of the plate-like component in the adhesive supply section, and releases the second section of the film-like component in the pre-press bonding section.

A sixth aspect of the invention provides a component mounting method for mounting a film-like component onto a plate-like component, with the plate-like component having a first placement section provided on one side edge and a second placement section provided on another side edge, and with the film-like component having a first section to be fixed provided on one side edge and a second section to be fixed provided on another side edge comprising: placing the first section of the film-like component onto the first placement section of the plate-like component; and placing the second section of the film-like component onto the second placement section of the plate-like component.

BRIEF DESCRIPTION OF THE DRAWINGS

Further objects and advantages of the present invention will become clear from the following description taking in conjunction with the preferred embodiments thereof with reference to the accompanying drawings, in which:

FIG. 2 is a perspective view illustrating component mounting equipment according to the embodiment of the invention;

DETAILED DESCRIPTION OF THE PREFERRED EMBODIMENTS

Preferred embodiments of the invention will be described in detail with reference to drawings.

Figure 1A:
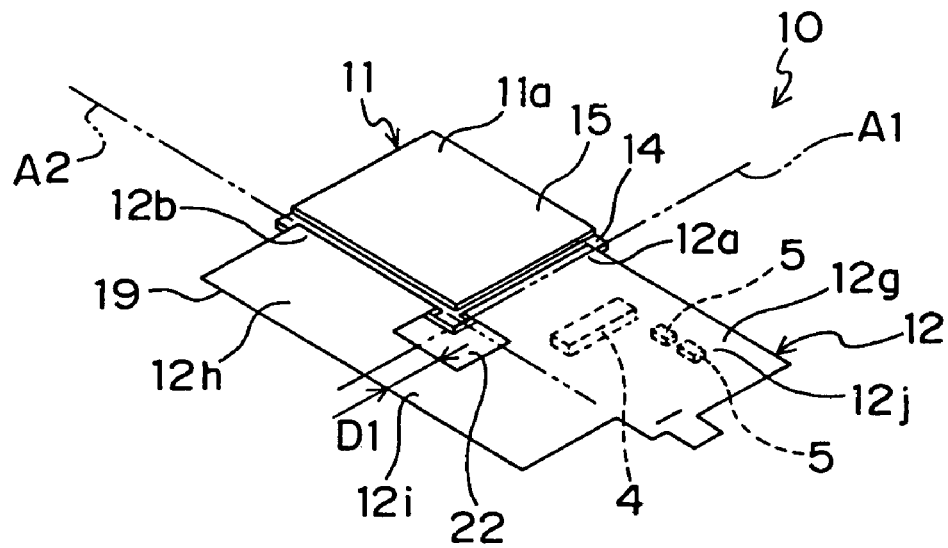
FIG. 1A is a perspective view illustrating an electronic component composed of an LCD board and an FPC board according to an embodiment of the invention.
Figure 1B:
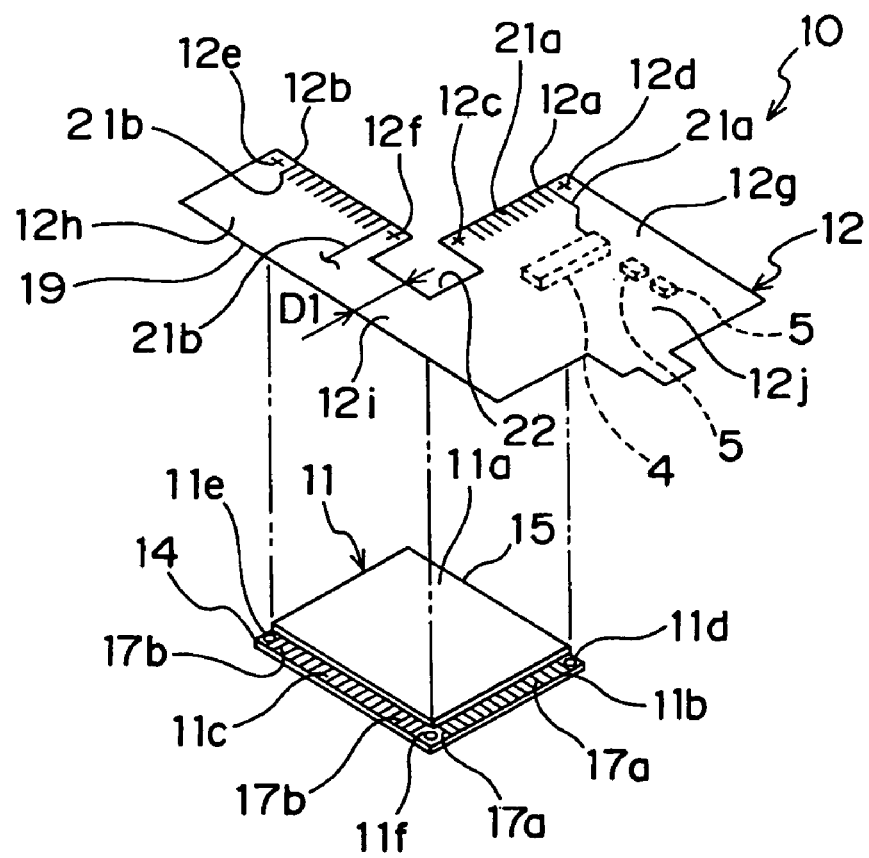
FIG. 1B is an exploded perspective view illustrating the electronic component.

An electronic component 10 according to an embodiment of the invention shown in FIGS. 1A and 1B comprises a liquid crystal display board (LCD board) 11 and a flexible printed-circuit board (FPC board) 12 mounted onto the LCD board 11.

In the LCD board 11, liquid crystal resin is enclosed between two enclosure plates 14 and 15 made of resin. The LCD board 11 has a liquid crystal display section 11a and has first and second electrode sections 11b and 11c on a rear side of the board (a side located at an inner side of equipment when the board is installed in the equipment). The first electrode section 11b, where ends of a plurality of driver voltage supply lines 17a are arranged, is provided on one side edge extending in a first direction A1. On the other hand, the second electrode section 11c, where ends of a plurality of driver voltage supply lines 17b are arranged, is provided on another side edge extending in a second direction A2. In this embodiment, the first direction A1 and the second direction A2 cross each other at nearly a right angle, and therefor the first electrode section 11b and the second electrode section 11c form a shape like a letter L in plan view. At one end of the first electrode section 11b, one end of the second electrode section 11c, and a connection of the first electrode section 11b and the second electrode section 11c are provided marks 11d, 11e, and 11f, respectively. By these marks 11d, 11e, and 11f, component mounting equipment 30, that will be described below, recognizes a position and a posture of the LCD board 11.

The FPC board 12 is comprised of a base film 19 made of flexible film on which a conductive layer is printed. On the FPC board 12, a driver circuit is configured by an IC 4, chip components 5, and the like. On a bottom surface side of the FPC board 12 in FIGS. 1A and 1B are provided first and second sections 12a and 12b to be fixed. The first section 12a is provided on one side edge extending in the first direction A1, and the second section 12b is provided on another side edge extending in the second direction A2. In the first and the second sections 12a and 12b are arranged ends of a plurality of driver voltage supply lines 21a and 21b, respectively. As described above, the first direction A1 and the second direction A2 cross each other at a right angle, and the first section 12a and the second section 12b form a shape like a letter L in plan view.

At both ends of the first section 12a are provided marks 12c and 12d by which the component mounting equipment 30, that will be described below, recognizes a position and a posture of the FPC board 12. At both ends of the second section 12b are similarly provided marks 12e and 12f by which the component mounting equipment 30 recognizes the position and the posture.

At a connection between the first section 12a and the second section 12b is provided a cut-out hole 22 where a rectangular portion of the base film 19 has been cut out. By provision of the cut-out hole 22, the FPC board 12 is divided into a first portion 12g, a second portion 12h, and a link portion 12i that links the portions 12g and 12h. The first portion 12g includes the first section 12a and an area (a component area 12j) where the IC 4, the chip components 5 and the like are mounted. On the other hand, the second portion 12h includes the second section 12b. A width D1 of the link portion 12i is smaller than widths of the first portion 12g and the second portion 12h, so that the base film 19 in the link portion 12i bends easily.

The first and the second sections 12a and 12b of the FPC board 12 are respectively placed onto the first and the second electrode sections 11b and 11c of the LCD board 11 with anisotropic conductive film tape (ACF tape), and the driver voltage supply lines 17a and 17b of the LCD board 11 are electrically connected to corresponding driver voltage supply lines 21a and 21b of the FPC board 12. Instead of ACF tape, anisotropic conductive paste (ACP) or the like may be used to place the first and the second sections 12a and 12b of the FPC board 12 onto the first and the second electrode sections 11b and 11c of the LCD board 11.

In the electronic component 10 of the embodiment, as described above, the first and the second sections 12a and 12b of the FPC board 12, which are provided on the two side edges extending in the first and second directions A1 and A2 crossing each other at a right angle, are placed onto the first and the second electrode sections 11b and 11c of the LCD board 11 which are provided on the two side edges extending similarly in the first and second directions A1 and A2. In other wards, the ends of the plurality of driver voltage supply lines 17a and 17b are respectively arranged in the first and second electrode sections 11b and 11c provided on different side edges of the LCD board 11. As a result, a number of the driver voltage supply lines 17a and 17b in the LCD board 11 can be increased without causing an increase of sizes of the LCD board 11 and the FPC board 12.

For example, if the LCD board 11 has an outside dimension of about 30 mm in length of one side and a pitch of the driver voltage supply lines 17a and 17b is about 50 µm, the number of the driver voltage supply lines 17a and 17b in the first and second electrode sections 11b and 11c is approximately 384 in each section at a maximum (approximately 768 in total in the first and second electrode sections 11b and 11c). This degree of the number of the driver voltage supply lines 17a and 17b permits a sufficient color display function to be performed.

Hereinbelow, component mounting equipment and a method of the invention suitable for production of the electronic component 10 will be described.

As shown in FIG. 2, the component mounting equipment 30 comprises a first mounting machine 31 for placing the first section 12a of the FPC board 12 onto the first electrode section 11b of the LCD board 11, and a second mounting apparatus 32 for placing the second section 12b of the FPC board 12 onto the second electrode section 11c of the LCD board 11. The component mounting equipment 30 also comprises a transporting apparatus 33 that connects the first mounting apparatus 31 and the second mounting apparatus 32. Moreover, the component mounting equipment 30 has a controller 34 connected to driving elements such as servo motors and air cylinders included in the first mounting apparatus 31, the second mounting apparatus 32, and the transporting apparatus 33. The controller 34 controls the driving elements included in the first mounting apparatus 31, the second mounting apparatus 32, and the transporting apparatus 33 on the basis of instructions inputted from recognition cameras and various sensors included in the first mounting apparatus 31, the second mounting apparatus 32, and the transporting apparatus 33 and instructions inputted from a control panel 35. The first mounting apparatus 31, the second mounting apparatus 32, and the transporting apparatus 33 may have respective controllers and respective control panels.

The first mounting apparatus 31 will be described initially. In the accompanying drawings, FIG. 3 shows an overall structure of the first mounting apparatus 31, and FIGS. 5 to 12 show structures of various parts of the first mounting apparatus 31.

Figure 3:
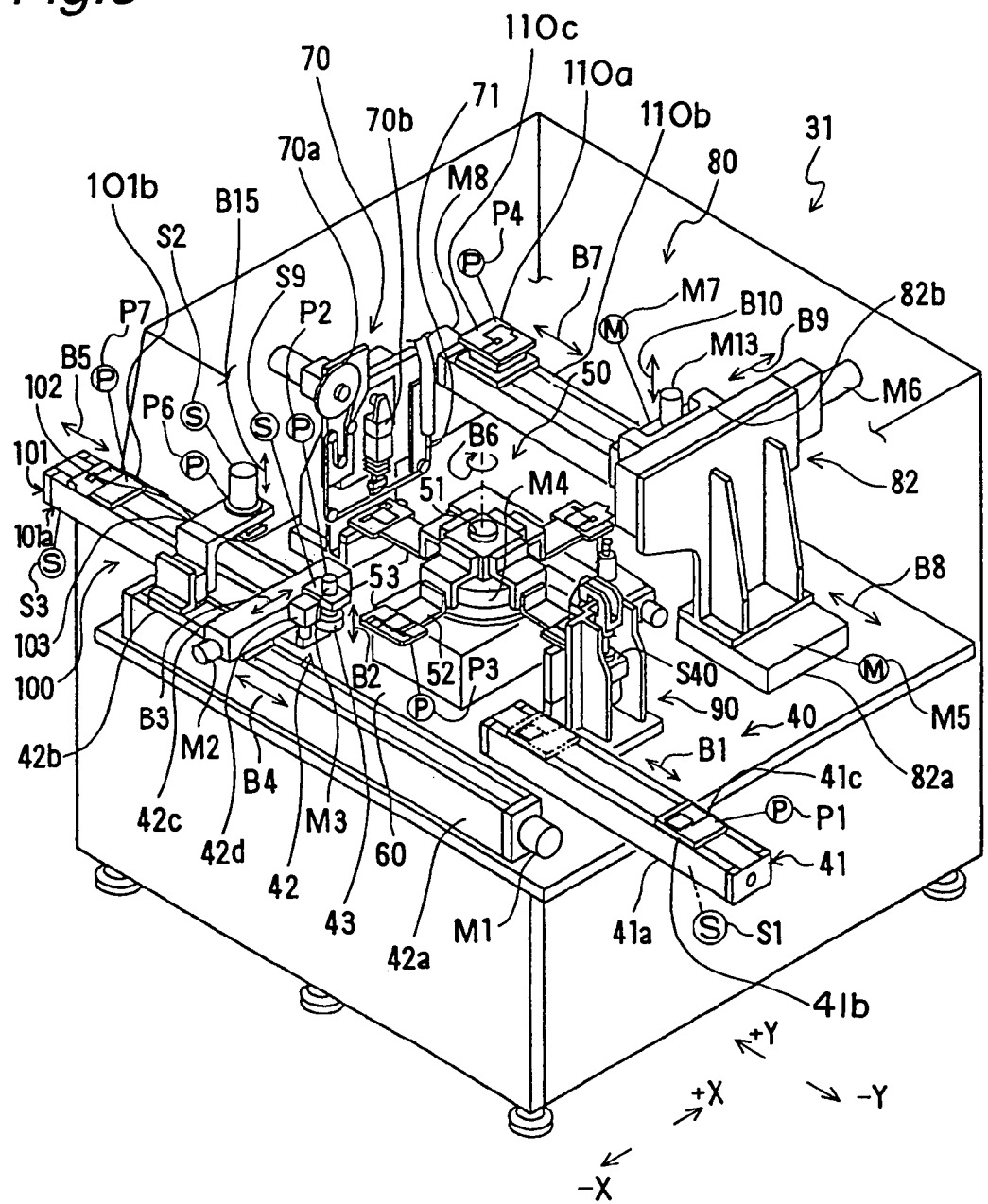
FIG. 3 is a perspective view illustrating a first mounting apparatus.

As shown in FIG. 3, the first mounting apparatus 31 has a carry-in section 40 for carrying an LCD board 11 into the apparatus, and a rotating transfer section 50 for transferring boards 11 fed from the carry-in section 40 into the apparatus. Around the rotating transfer section 50 are provided a hand over section 60, an ACF supply section 70, a pre-press bonding section 80, and a final press bonding section 90. In addition, the first mounting apparatus 31 has a carry-out section 100 for carrying an LCD board 11 and an FPC board 12 from the rotating transfer section 50 to outside of the apparatus.

The carry-in section 40 has a carry-in slider 41 and a carry-in arm 42.

Figure 5:
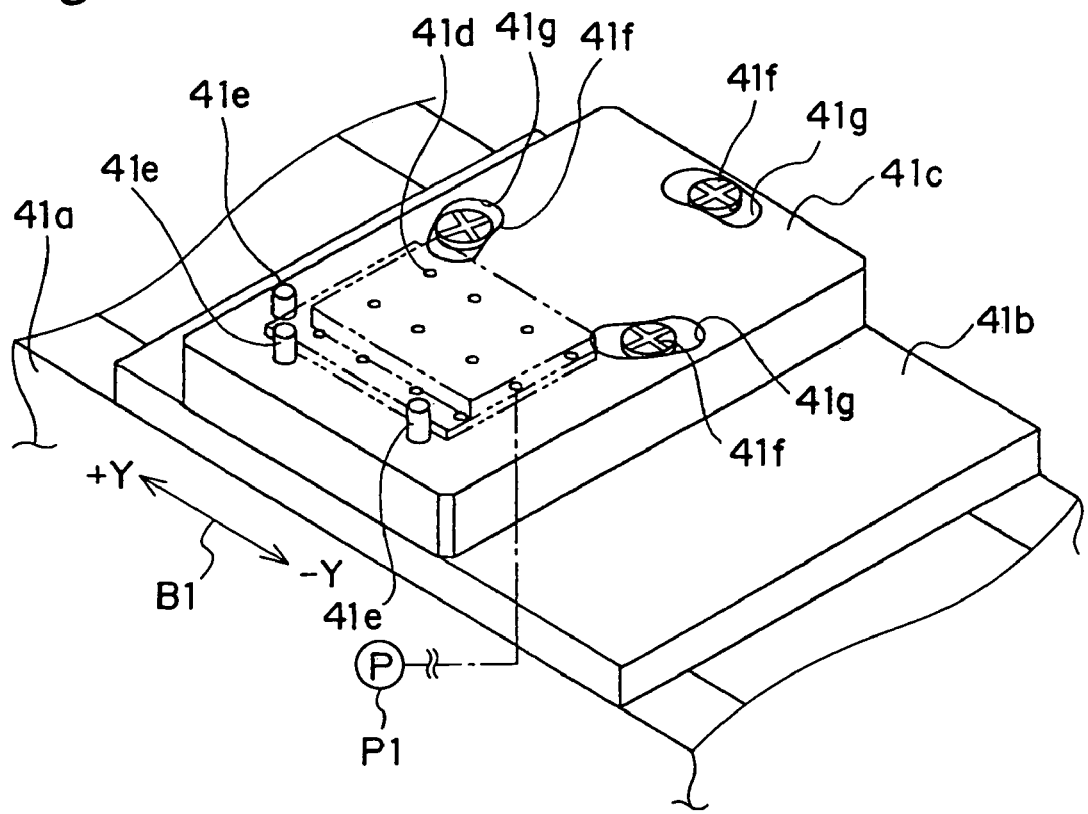
FIG. 5 is a partial perspective view illustrating a carry-in slider of the first mounting apparatus.

The carry-in slider 41 has a guide rail 41a and a slide plate 41b that is driven by an air cylinder S1 to reciprocate linearly in a direction of arrow B1 on the guide rail 41a. As shown in FIG. 5, a loading plate 41c on which an LCD board 11 is to be loaded is fixed to the slide plate 41b. In the loading plate 41c is provided a plurality of suction holes 41d. These suction holes 41d are connected to a vacuum pump P1 so that an LCD board 11 can be sucked and held on the loading plate 41c. On the loading plate 41c are provided pins 41e for the alignment of the LCD board 11. The loading plate 41c is fixed to the slide plate 41b with three bolts 41f. Holes 41g in which these bolts 41f are inserted have a shape that is not a perfect circle, but rather a distorted ellipse, so that a posture of the loading plate 41c can be adjusted with respect to the slide plate 41b.

Figure 6:
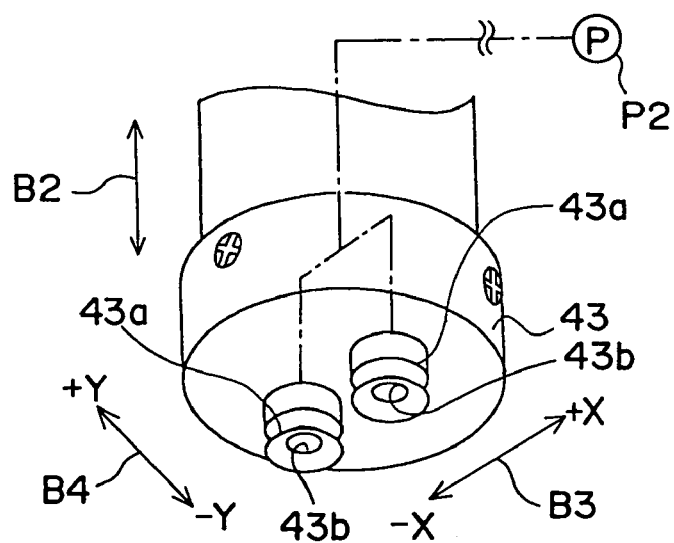
FIG. 6 is a partial perspective view illustrating a carry-in head of the first mounting apparatus.

The carry-in arm 42 has a guide rail 42a and a slide plate 42b driven by a servo motor M1 to reciprocate linearly in a direction of arrow B4 on the guide rail 42a. To the slide plate 42b is fixed a guide rail 42c extending in a direction orthogonal to the guide rail 42a. On the guide rail 42c is provided a carry-in head 43 driven by a servo motor M2 to move linearly in a direction indicated by arrow B3. The carry-in head 43 extends downward and, as shown in FIG. 6, a lower end thereof is provided with suction holes 43b on which suction pads 43a are installed. The suction holes 43b are pneumatically connected to a vacuum pump P2 so that an LCD board 11 can be sucked and held on the lower end of the carry-in head 43. The carry-in head 43 is driven by an air cylinder S9 (see FIG. 3) so as to move vertically as shown by arrow B2. Moreover, the carry-in head 43 is capable of turning about its axis by drive of a motor M3. In addition, there is provided a recognition camera 42d that moves integrally with the carry-in head 43.

The rotating transfer section 50 comprises a rotating shaft 51 extending vertically and intermittently rotated by a motor M4 in a direction shown by arrow B6 in steps of 90 degrees, and has four arms 52 with proximal ends thereof being fixed to the rotating shaft 51 so that the arms 52 form angles of 90 degrees with each other about the rotating shaft 51 in plan view. At a distal end of each arm 52 is installed an index stage 53 for holding an LCD board 11. At positions corresponding to the distal ends of the arms 52 are provided the hand over section 60 for handling over an LCD board 11 from the carry-in section 40 to the rotating transfer section 50, and from the rotating transfer section 50 to a carry-out section 100, the ACF supply section 70, the pre-press bonding section 80, and the final press bonding section 90 in order of mention along a direction of the rotation of the index stages 53 shown by arrow B6.

Figure 7:
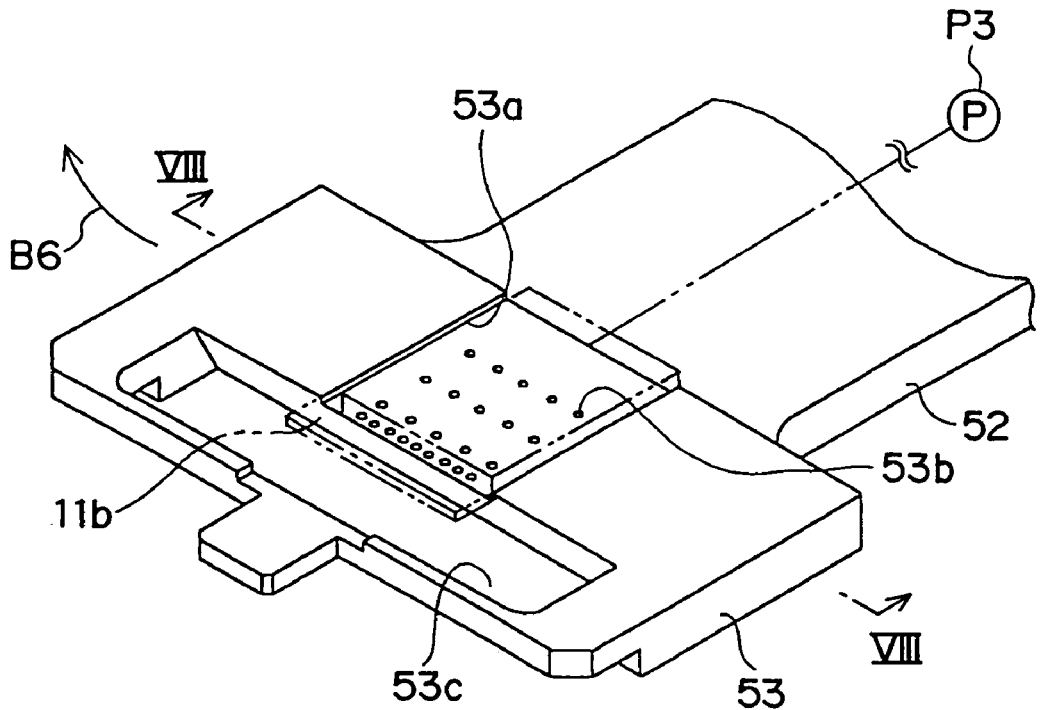
FIG. 7 is a partial perspective view illustrating an index stage of the first mounting apparatus.
Figure 8:
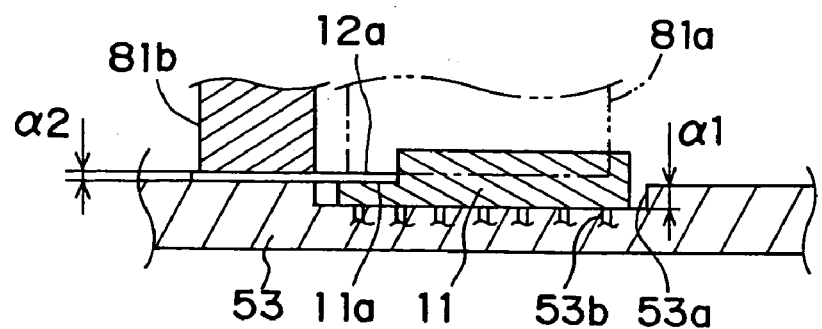
FIG. 8 is a schematic partial sectional view taken along line VIII—VIII in FIG. 7.

As shown in FIGS. 7 and 8, a recess 53a, where an LCD board 11 is to be loaded, is provided in each index stage 53 and a plurality of suction holes 53b is provided at a bottom of the recess 53a. The suction holes 53b are pneumatically connected to a vacuum pump P3 so that an LCD board 11 can be sucked and held on the index stage 53. On a distal side of each index stage 53, an insertion hole 53c into which later mentioned heating-pressurizing tools, of the pre-press bonding section 80 and the final press bonding section 90, are to be inserted is provided so as to penetrate through the index stage in a direction of thickness thereof. Additionally, each index stage 53 has a heater as an auxiliary heating unit for heating an LCD board 11 in later mentioned processes of ACF supplying, pre-press bonding, and final press bonding.

The ACF supply section 70 applies anisotropic conductive film tape (ACF tape) 71 on the first electrode section 11b of an LCD board 11 held on the index stage 53. The ACF supply section 70 has a supply source 70a of ACF tape 71, a heating-pressurizing tool 70b for pressing ACF tape 71 onto the first electrode section 11b of the LCD board 11 and heating the tape (for example, up to 80° C.), and a cutter for cutting the ACF tape 71 to a length corresponding to the first electrode section 11b after pressurization by the heating-pressurizing tool 70b (not shown).

Figure 9:
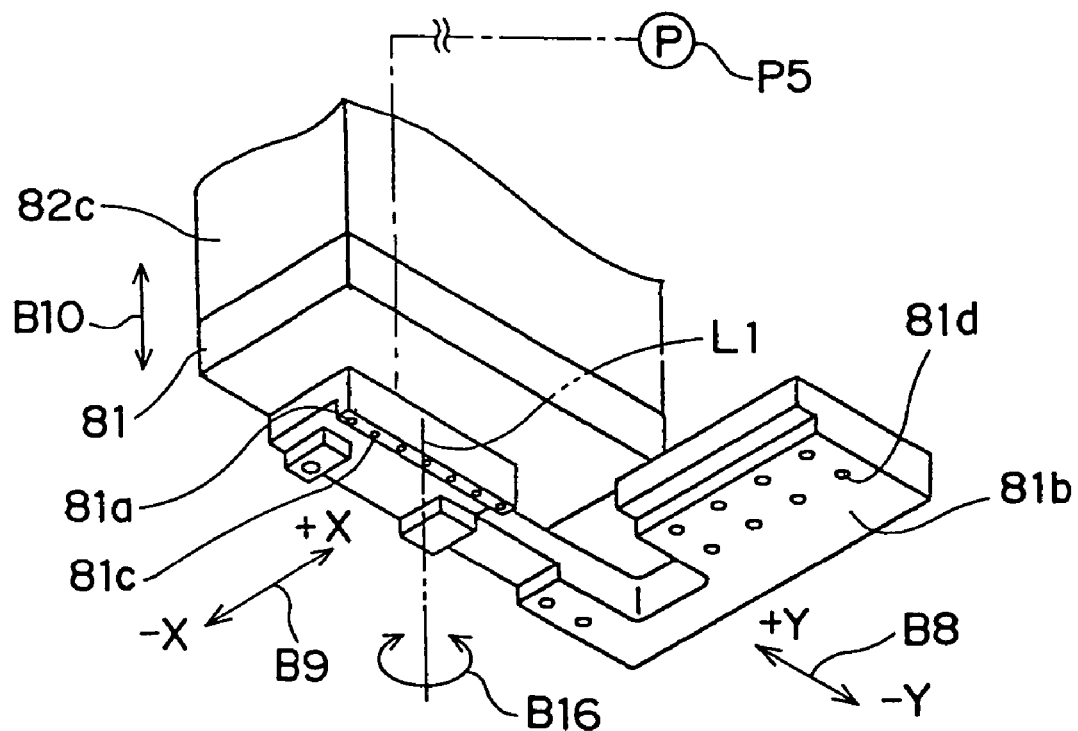
FIG. 9 is a partial perspective view illustrating a suction head of the first mounting apparatus.
Figure 10:
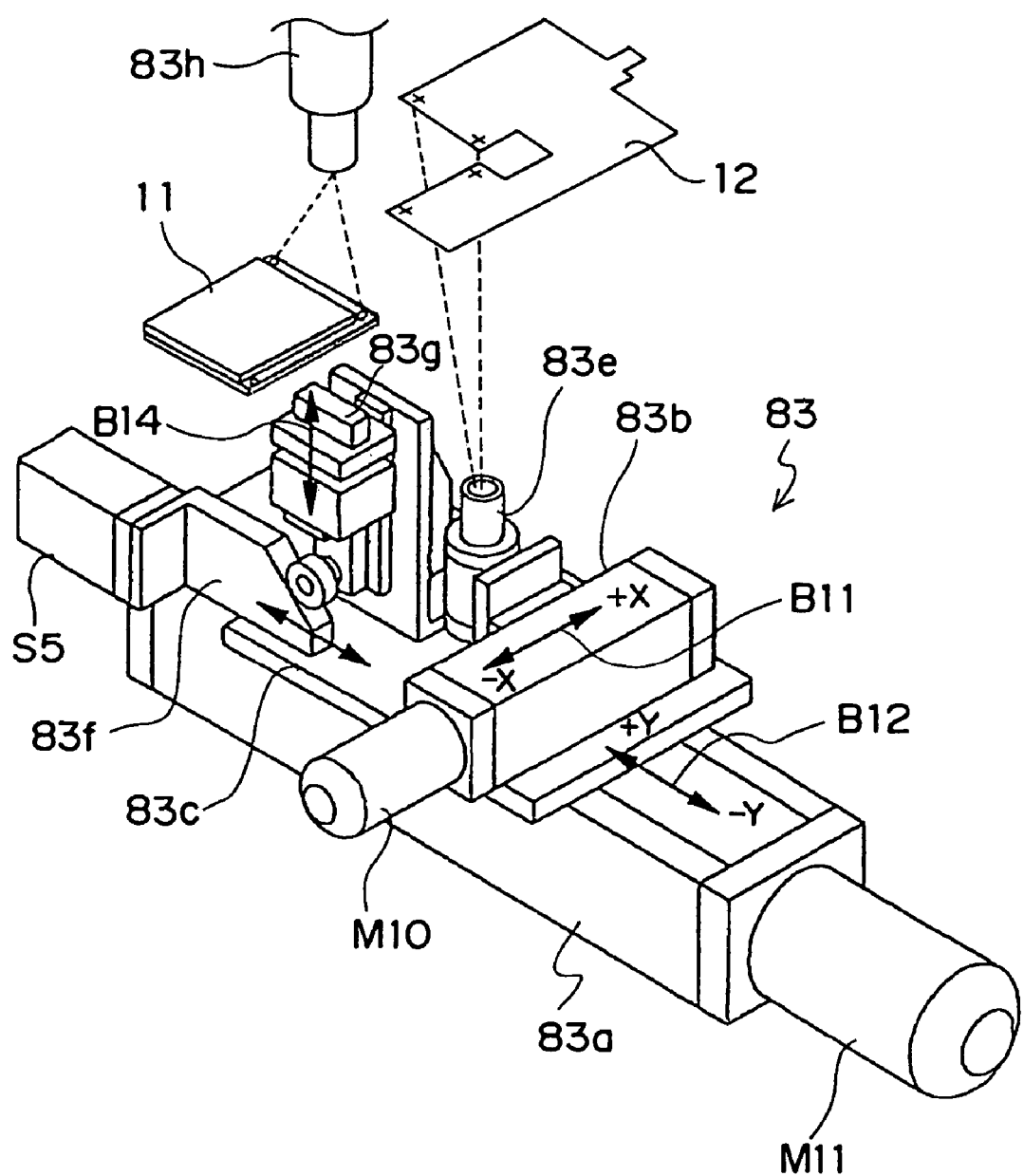
FIG. 10 is a perspective view illustrating a pre-press bonding section of the first mounting apparatus.

The pre-press bonding section 80 comprises an FPC alignment section 82 provided with an FPC pre-press bonding head 81 shown in FIG. 9 and a press bonding section 83 shown in FIG. 10.

The FPC alignment section 82 has a base 82a driven by a servo motor M5 to move linearly in a direction shown by arrow B8, and a slide section 82b slidably installed on the base 82a and driven by a motor M6 to move linearly in a direction shown by arrow B9. On the slide section 82b is installed an arm 82c extending vertically (see FIG. 9). The arm 82c is driven by a servo motor M7 so as to be capable of moving up and down as shown by arrow B10. The arm 82c is also driven by a motor M13 so as to be capable of turning about an axis L1 thereof (see FIG. 9). As shown in FIG. 9, the FPC pre-press bonding head 81 is fixed to a lower end of the arm 82c. Thus, the FPC pre-press bonding head 81 is capable of moving in horizontal directions orthogonal to each other as shown by arrows B8 and B9, moving vertically as shown by arrow B10, and rotating about the axis L1 as shown by arrow B16. The FPC pre-press bonding head 81 has a first portion 81a for sucking the first section 12a of the FPC board 12 and a second portion 81b for sucking the second section 12b of the FPC board 12. The first and second portions 81a and 81b are respectively provided with a plurality of suction holes 81c and 81d pneumatically connected to a vacuum pump P5.

As shown in FIG. 10, the press bonding section 83 has a table 83c driven by servo motors M10 and M11 to move linearly on guide rails 83a and 83b as shown by arrows B11 and B12. On the table 83c are installed a heating-pressurizing tool 83g for pressing the first section 12a of an FPC board 12 onto the first electrode section 11b of an LCD board 11 and heating these sections (for example, up to 80° C.), and a recognition camera 83e for the FPC board 12. On the table 83c is also provided a cam 83f moved linearly by an air cylinder S5. The heating-pressurizing tool 83g driven by the cam 83f moves up and down as shown by arrow B14. Additionally, the press bonding section 83 has a recognition camera 83h for the LCD board 11.

Adjacent to the pre-press bonding section 80, an FPC supply section 110 is provided. The FPC supply section 110 has an FPC supply slider 110a. On a guide rail 110b of the FPC supply slider 110a, a slide plate 110c driven by a servo motor M8 reciprocates linearly as shown by arrow B7. The slide plate 110c is capable of sucking and holding an FPC board 12 by operation of a vacuum pump P4.

The final press bonding section 90 has an air cylinder S40 provided so as to extend vertically and a heating-pressurizing tool installed on a distal end of the air cylinder S40 (not shown). This heating-pressurizing tool presses the first section 12a of an FPC board 12 onto the first electrode section 11b of an LCD board 11 and heats these sections (for example, up to 200° C.).

The carry-out section 100 has a carry-out slider 101 and a carry-out arm 102.

Figure 12:
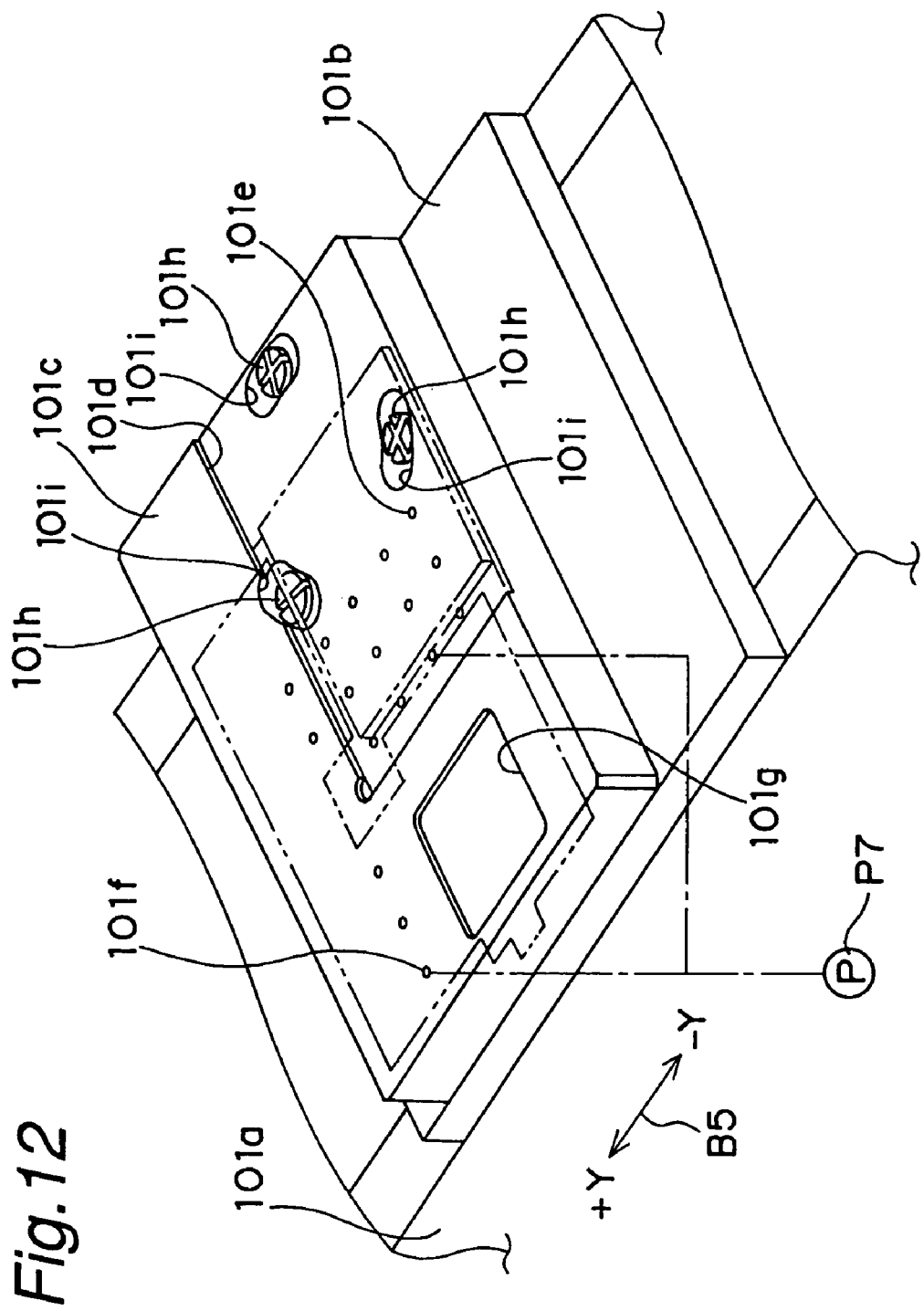
FIG. 12 is a partial perspective view illustrating a carry-out slider of the first mounting apparatus.

The carry-out slider 101 has a guide rail 101a and a slide plate 101b driven by an air cylinder S3 to reciprocate linearly on the guide rail 101a in a direction of arrow B5. As shown in FIG. 12, a loading plate 101c on which an LCD board 11 and an FPC board 12 are to be loaded is fixed to the slide plate 101b. On the loading plate 101c is provided a recess 101d where the LCD board 11 is to be loaded. At a bottom of the recess 101d is provided a plurality of suction holes 101e for sucking the LCD board 11. The suction holes 101e are pneumatically connected to a vacuum pump P7. Around the recess 101d of the loading plate 101c is provided a plurality of suction holes 101f for sucking the FPC board 12, and the suction holes 101f also are pneumatically connected to the vacuum pump P7. In an area of the loading plate 101c corresponding to the component area 12j of the FPC board 12 is provided a recess 101g for preventing interference with the IC 4 and the chip components 5. The loading plate 101c is fixed to the slide plate 101b with three bolts 101h. Holes 101i in which the bolts 101h are inserted have a shape that is not a perfect circle, but rather a distorted ellipse, so that a posture of the loading plate 101c can be adjusted with respect to the slide plate 101b.

Figure 11:
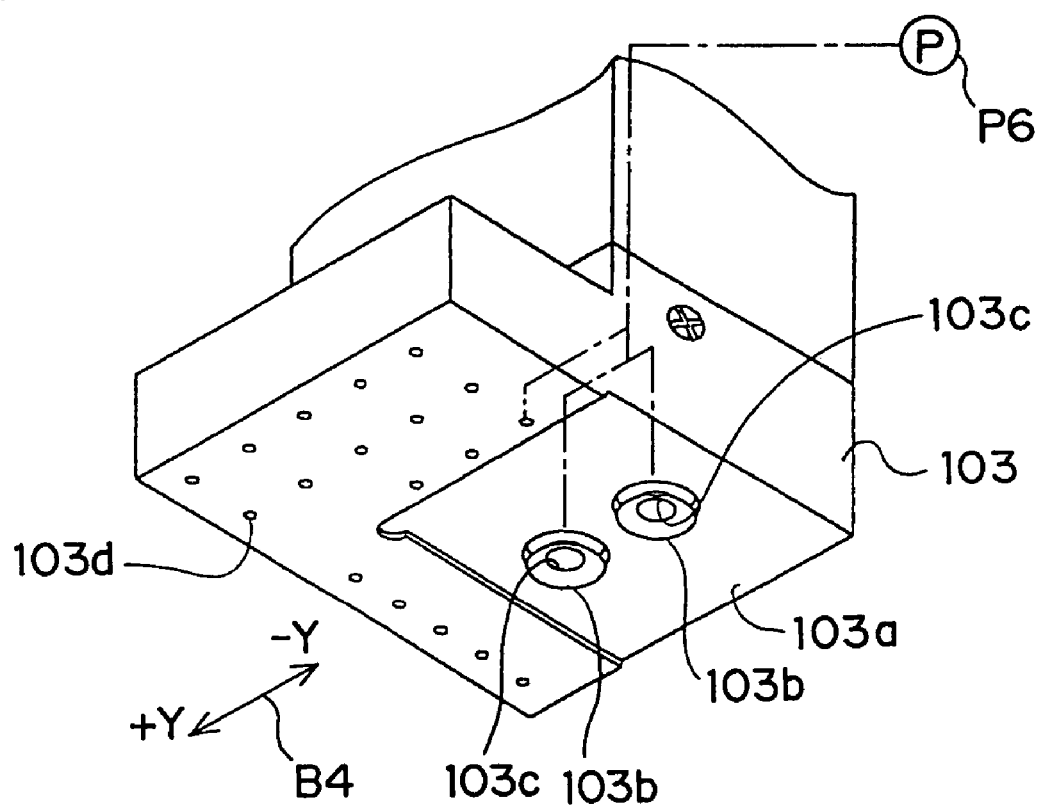
FIG. 11 is a partial perspective view illustrating a carry-out head of the first mounting apparatus.

The carry-out arm 102 is fixed to the slide plate 42b to which the carry-in arm 42 is fixed in common. On a distal end of the carry-out arm 102 is provided a carry-out head 103 extending downward. As shown in FIG. 11, a recess 103a in which an LCD board 11 is to be placed is provided on a lower end of the carry-out head 103, and suction holes 103c for sucking the LCD board 11 are provided on a bottom of the recess 103a, with the suction holes 103a respectively being provided with suction pads 103b. The suction holes 103a are pneumatically connected to a vacuum pump P6. Around the recess 103a of the carry-out head 103 is provided a plurality of suction holes 103d for sucking an FPC board 12. The suction holes 103d also are connected to the vacuum pump P6. The carry-out head 103 is driven by an air cylinder S2 (see FIG. 3) to move up and down as shown by arrow B15.

Hereinbelow, the transporting apparatus 33 will be described with reference to FIG. 2.

The transporting apparatus 33 has a guide rail 33a and a slide plate 33b driven by a servo motor M21 to reciprocate linearly in a direction of arrow C1 on the guide rail 33a. To the slide plate 33b is fixed a guide rail 33c extending in a direction that intersects the guide rail 33a at a right angle. On the guide rail 33c is provided a transporting head 134 driven by a servo motor M22 to reciprocate linearly in a direction of arrow C2. To the transporting head 134 is pneumatically connected a vacuum pump P50 for sucking and holding an LCD board 11 and an FPC board 12 on a bottom surface of the head. The transporting head 134 is driven by an air cylinder S50 so as to be capable of moving vertically as shown by arrow C3 and is driven by a motor M23 so as to be capable of rotating about a vertical axis L2 as shown by arrow C4. The transporting apparatus 33 is also provided with a recognition camera 135 that moves integrally with the transporting head 134.

Hereinbelow, the second mounting apparatus 32 will be described. In the accompanying drawings, FIG. 4 shows an overall structure of the second mounting apparatus 32, and FIGS. 13 to 19 show structures of various sections of the second mounting apparatus 32.

Figure 4:
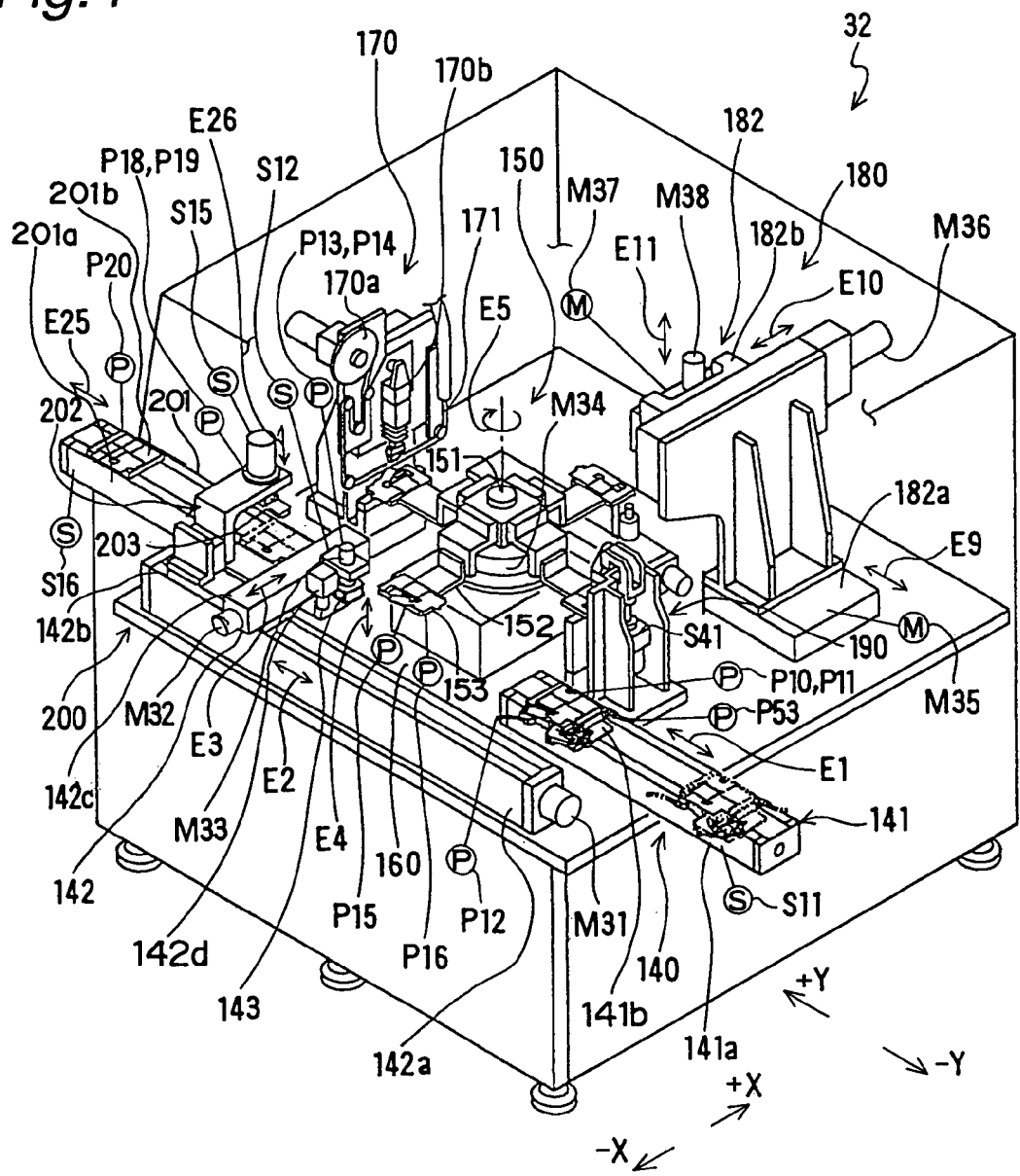
FIG. 4 is a perspective view illustrating a second mounting apparatus.

As shown in FIG. 4, the second mounting apparatus 32 comprises a carry-in section 140 for carrying an LCD board 11 and an FPC board 12 from the transporting apparatus 33 into the apparatus 32, and a rotating transfer section 150 for transferring LCD boards 11 and FPC boards 12 fed from the carry-in section 140 into the apparatus. Around the rotating transfer section 150 are provided a hand over section 160, an ACF supply section 170, a pre-press bonding section 180, and a final press bonding section 190. In addition, the second mounting apparatus 32 comprises a carry-out section 200 for carrying out the LCD board 11 and the FPC board 12 from the rotating transfer section 150 to outside of the apparatus.

The carry-in section 140 comprises a carry-in slider 141 and a carry-in arm 142.

The carry-in slider 141 has a guide rail 141a and a slide plate 141b driven by an air cylinder S11 to reciprocate linearly in a direction of arrow E1 on the guide rail 141a.

Figure 13:
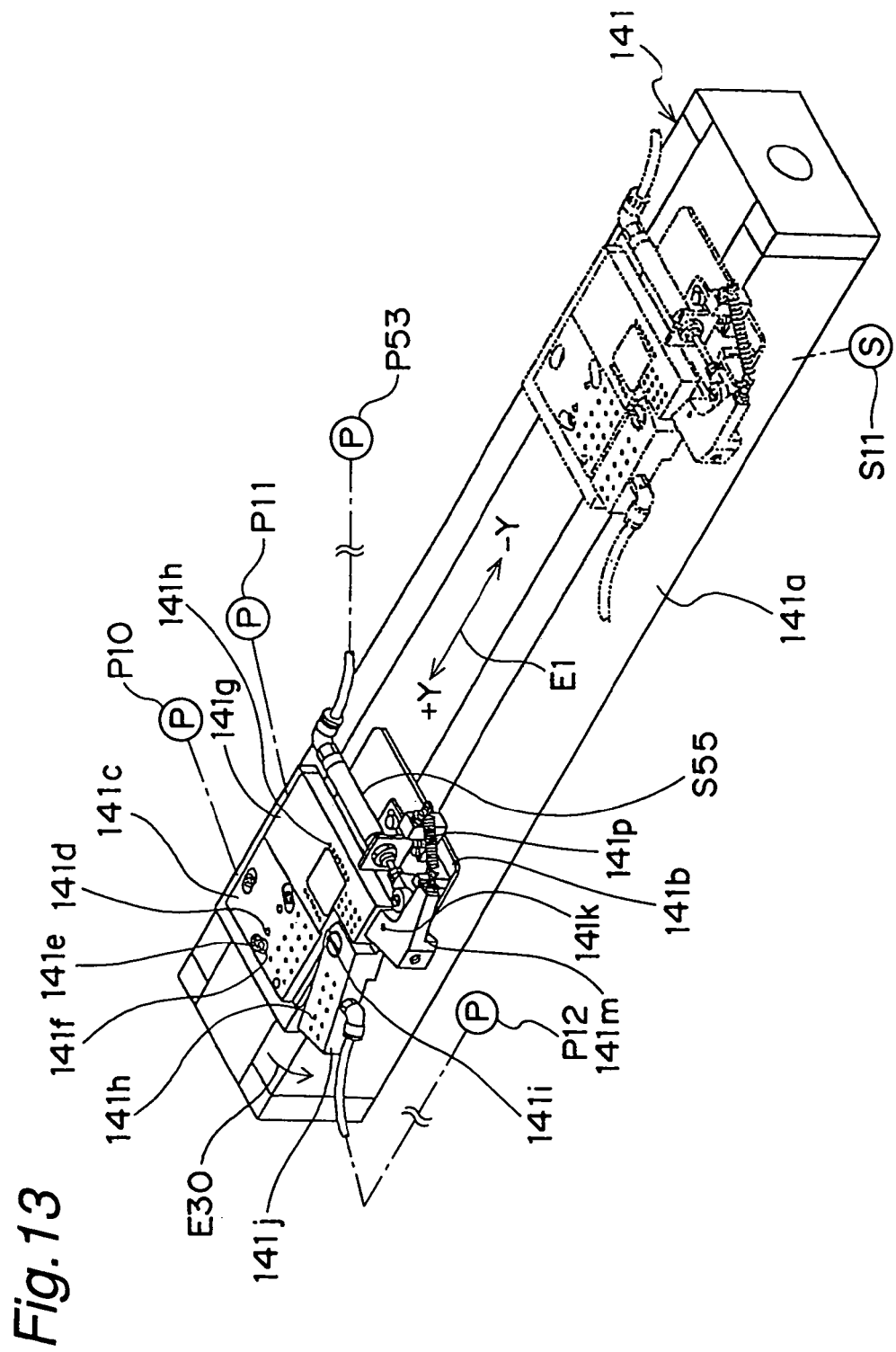
FIG. 13 is a partial perspective view illustrating a carry-in slider of the second mounting apparatus.

As shown in FIG. 13, an LCD loading plate 141c (a first holding mechanism) onto which an LCD board 11 is to be loaded is fixed to the slide plate 141b. The LCD loading plate 141c is provided with a plurality of suction holes 141d. The suction holes 141d are pneumatically connected to a vacuum pump P10 so that the LCD board 11 can be sucked and held on the LCD loading plate 141c. The LCD loading plate 141c is fixed to the slide plate 141b with three bolts 141e. Holes 141f, into which the bolts 141e are inserted, have a shape that is not a perfect circle, but rather a distorted ellipse, so that a posture of the LCD loading plate 141c can be adjusted with respect to the slide plate 141b.

To the slide plate 141b is fixed a fixed FPC loading plate 141g (a second holding mechanism) adjacent to the LCD loading plate 141c. The fixed FPC loading plate 141g is provided with a plurality of suction holes 141h for sucking the first portion 12g of an FPC board 12. The suction holes 141h are pneumatically connected to a vacuum pump P11.

On the slide plate 141b are installed a movable FPC loading plate 141j (a third holding mechanism) of which a proximal end side is capable of pivoting about a shaft 141i in a horizontal plane, and a lever 141m which is capable of pivoting about a shaft 141k in a horizontal plane.

The movable FPC loading plate 141j is provided with suction holes 141n for sucking the second portion 12h and the link portion 12i of an FPC board 12. The suction holes 141n are pneumatically connected to a vacuum pump P12 other than the vacuum pumps P10 and P11. The lever 141m has a distal end engaged with the movable FPC loading plate 141j and a proximal end connected to a spring 141p. The spring 141p elastically biases the lever 141m in a counterclockwise direction in plan view. One end of an air cylinder S55 that is driven by a pump P53 is in contact with a portion of the lever 141m nearer to the proximal end of the lever 141m than the shaft 141k. When the air cylinder S55 is in its projecting position as shown by a solid line in FIG. 13, the lever 141m pivots in a clockwise direction in plan view against a biasing force caused by the spring 141p. As a result, a distal end of the movable FPC loading plate 141j moves away from the LCD loading plate 141c as shown by arrow E30, and the movable FPC loading plate 141j and the LCD loading plate 141c form a shape like a letter V in plan view. On the other hand, when the air cylinder S55 is in its retracted position as shown by a dotted line in FIG. 13, the lever 141m pivots counterclockwise in plan view by the biasing force the spring 141p exerts. As a result, an extremity of the movable FPC loading plate 141j is brought into intimate contact with the LCD loading plate 141c.

The carry-in arm 142 has a guide rail 142a and a slide plate 142b driven by a servo motor M31 to reciprocate linearly in a direction of arrow E2 on the guide rail 142a. To the slide plate 142b is fixed a guide rail 142c extending in a direction orthogonal to the guide rail 142a. On the guide rail 142c is provided a carry-in head 143 driven by a servo motor M32 to move linearly in a direction of arrow E3. Additionally, the carry-in head 143 is driven by an air cylinder S12 so as to move up and down as shown by arrow E4. Moreover, the carry-in head 143 is capable of rotating about its axis by drive of a motor M33. In addition, there is provided a recognition camera 142d that moves integrally with the carry-in head 143.

Figure 14:
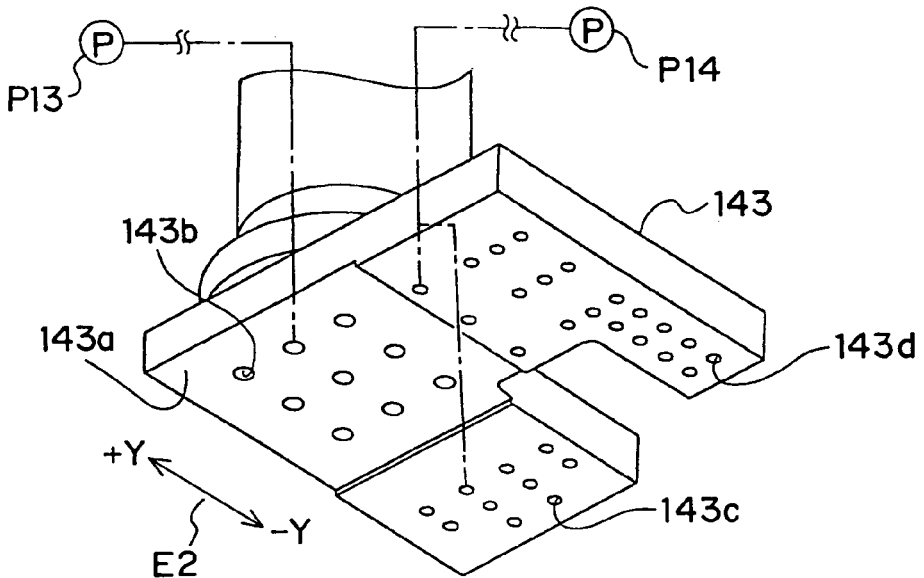
FIG. 14 is a partial perspective view illustrating a carry-in head of the second mounting apparatus.

As shown in FIG. 14, a recess 143a in which an LCD board 11 is to be placed is provided on a lower end of the carry-in head 143. A plurality of suction holes 143b provided in the recess 143a is pneumatically connected to a vacuum pump P13 so that the LCD board 11 can be sucked and held to the lower end of the carry-in head 143. Around the recess 143a is provided a plurality of suction holes 143c for sucking the first portion 12g of an FPC board 12 and a plurality of suction holes 143d for sucking the second portion 12h and the link portion 12i of the FPC board 12. The suction holes 143c and 143d are pneumatically connected to a vacuum pump P14 other than the vacuum pump P13 for sucking an LCD board 11.

The rotating transfer section 150 has a rotating shaft 151 extending vertically and intermittently rotated by a motor M34 in a direction shown by arrow E5 in steps of 90 degrees, and has four arms 152 with proximal ends thereof being fixed to the rotating shaft 151 so that the arms 152 form angles of 90 degrees with each other about the rotating shaft 151 in plan view. At a distal end of each arm 152 is installed an index stage 153 for holding an LCD board 11 and an FPC board 12. At positions corresponding to the distal ends of the arms 152 are provided the hand over section 160 for handing over an LCD board 11 and a FPC board from the carry-in section 140 to the rotating transfer section 150 and from the rotating transfer section 150 to the carry-out section 200, the ACF supply section 170, the pre-press bonding section 180, and the final press bonding section 190 in order of mention along a direction of rotation shown by arrow E5.

Figure 15:
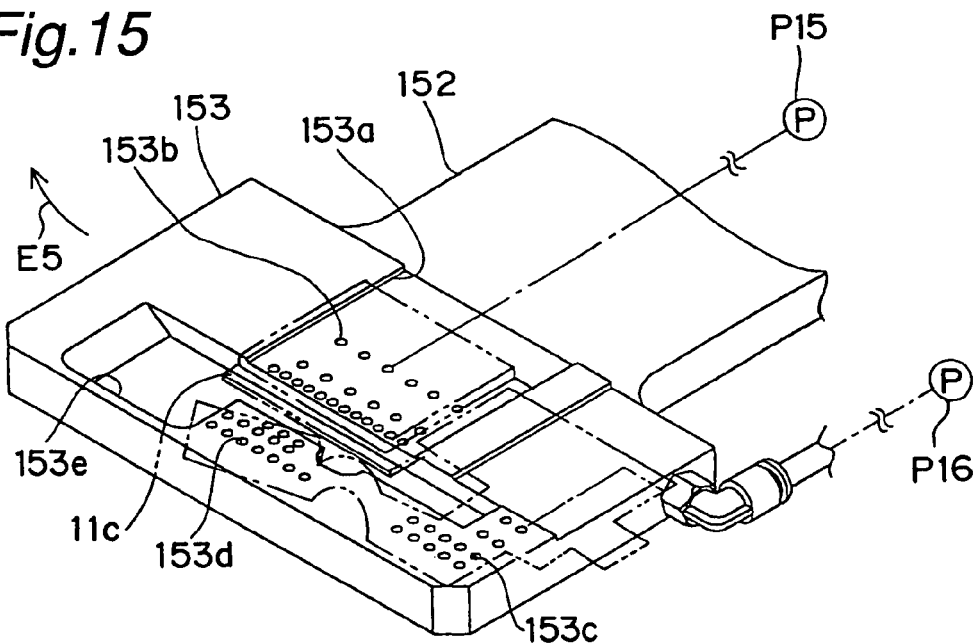
FIG. 15 is a partial perspective view illustrating an index stage of the second mounting apparatus.

As shown in FIG. 15, a recess 153a where an LCD board 11 is to be loaded is provided in each index stage 153, and a plurality of suction holes 153b is provided at a bottom of the recess 153a. The suction holes 153b are pneumatically connected to a vacuum pump P15 so that an LCD board 11 can be sucked and held on the index stage 153. Around the recess 153a is provided a plurality of suction holes 153c for sucking the first portion 12g of an FPC board 12, and a plurality of suction holes 153d for sucking the second portion 12h and the link portion 12i of the FPC board 12. The suction holes 153c and 153d are pneumatically connected to a vacuum pump P16 other than the vacuum pump P15. On a distal side of each index stage 153, an insertion hole 153e into which later mentioned heating-pressurizing tools, of the pre-press bonding section 180 and the final press bonding section 190, are to be inserted is provided so as to penetrate through the index stage 153 in a direction of thickness thereof. Additionally, each index stage 153 has a heater as an auxiliary heating unit for heating an LCD board 11 and an FPC board 12 in later mentioned processes of ACF supplying, pre-press bonding, and final press bonding.

The ACF supply section 170 applies ACF tape 171 on the second electrode section 11c of an LCD board 11 held on the index stage 153. The ACF supply section 170 has a supply source 170a of ACF tape 171, a heating-pressurizing tool 170b for pressing the ACF tape 171 onto the second electrode section 11c of the LCD board 11 and heating the tape (for example, up to 80° C.), and a cutter for cutting the ACF tape 171 to a length corresponding to the second electrode section 11c after pressurization by the heating-pressurizing tool 170b (not shown).

Figure 16:
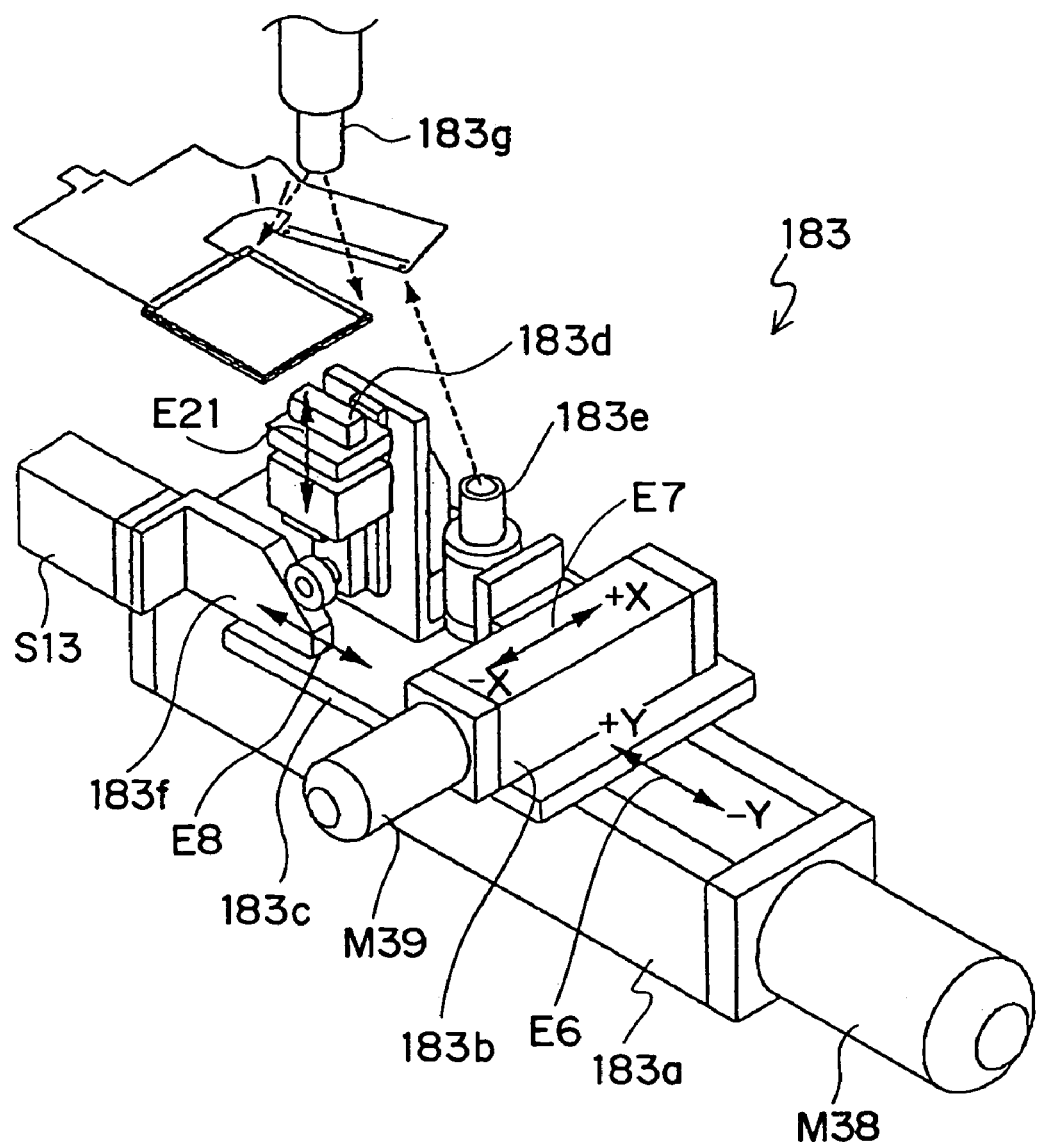
FIG. 16 is a perspective view illustrating a pre-press bonding section of the second mounting apparatus.
Figure 17:
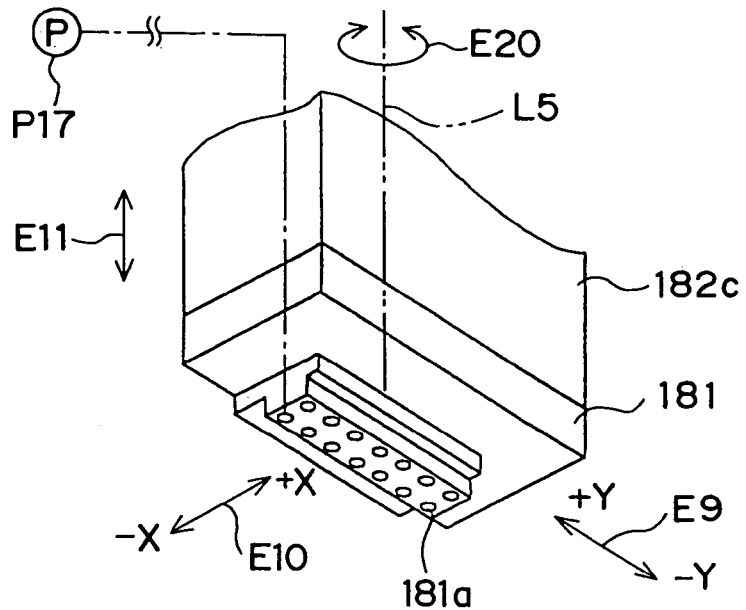
FIG. 17 is a partial perspective view illustrating a suction head of the second mounting apparatus.

The pre-press bonding section 180 comprises an FPC alignment section 182 provided with an FPC pre-press bonding head (an aligning head) 181 shown in FIG. 17, and a press bonding section 183 shown in FIG. 16.

The FPC alignment section 182 has a base 182a driven by a servo motor M35 to move linearly in a direction shown by arrow E9, and a slide section 182b slidably installed on the base 182a and driven by a motor M36 to move linearly in a direction shown by arrow E10. On the slide section 182b is installed an arm 182c extending vertically (see FIG. 17). The arm 182c is driven by a servo motor M37 so as to be capable of moving up and down as shown by arrow E11. The arm 182c is also driven by a motor M38 so as to be capable of turning about an axis L5 (see FIG. 17) of the arm itself. As shown in FIG. 17, the FPC pre-press bonding head 181 is fixed to a lower end of the arm 182c. Thus, the FPC pre-press bonding head 181 is capable of moving in horizontal directions orthogonal to each other as shown by arrows E9 and E10, moving vertically as shown by arrow E11, and rotating about the axis L5 as shown by arrow E20. The FPC pre-press bonding head 181 has a plurality of suction holes 181a for sucking the second section 12b of an FPC board 12. To the suction holes 181a is pneumatically connected a vacuum pump P17.

As shown in FIG. 16, the press bonding section 183 has a table 183c driven by servo motors M38 and M39 to move linearly on guide rails 183a and 183b as shown by arrows E6 and E7. On the table 183c are installed a heating-pressurizing tool 183d for pressing the second section 12b of an FPC board 12 onto the second electrode section 11c of an LCD board 11 and heating these sections (for example, up to 80° C.), and a recognition camera 183e for an FPC board 12. On the table 183c is also provided a cam 183f moved linearly in a direction of arrow E8 by an air cylinder S13. The heating-pressurizing tool 183d driven by the cam 183f moves up and down as shown by arrow E21. Additionally, the press bonding section 183 has a recognition camera 183g for an LCD board 11.

The final press bonding section 190 has an air cylinder S41 provided so as to extend vertically, and a heating-pressurizing tool (not shown) installed on a distal end of the air cylinder S41. This heating-pressurizing tool presses the second section 12b of an FPC board 12 onto the second electrode section 11c of an LCD board 11 and heats these sections (for example, up to 200° C.).

The carry-out section 200 has a carry-out slider 201 and a carry-out arm 202.

Figure 19:
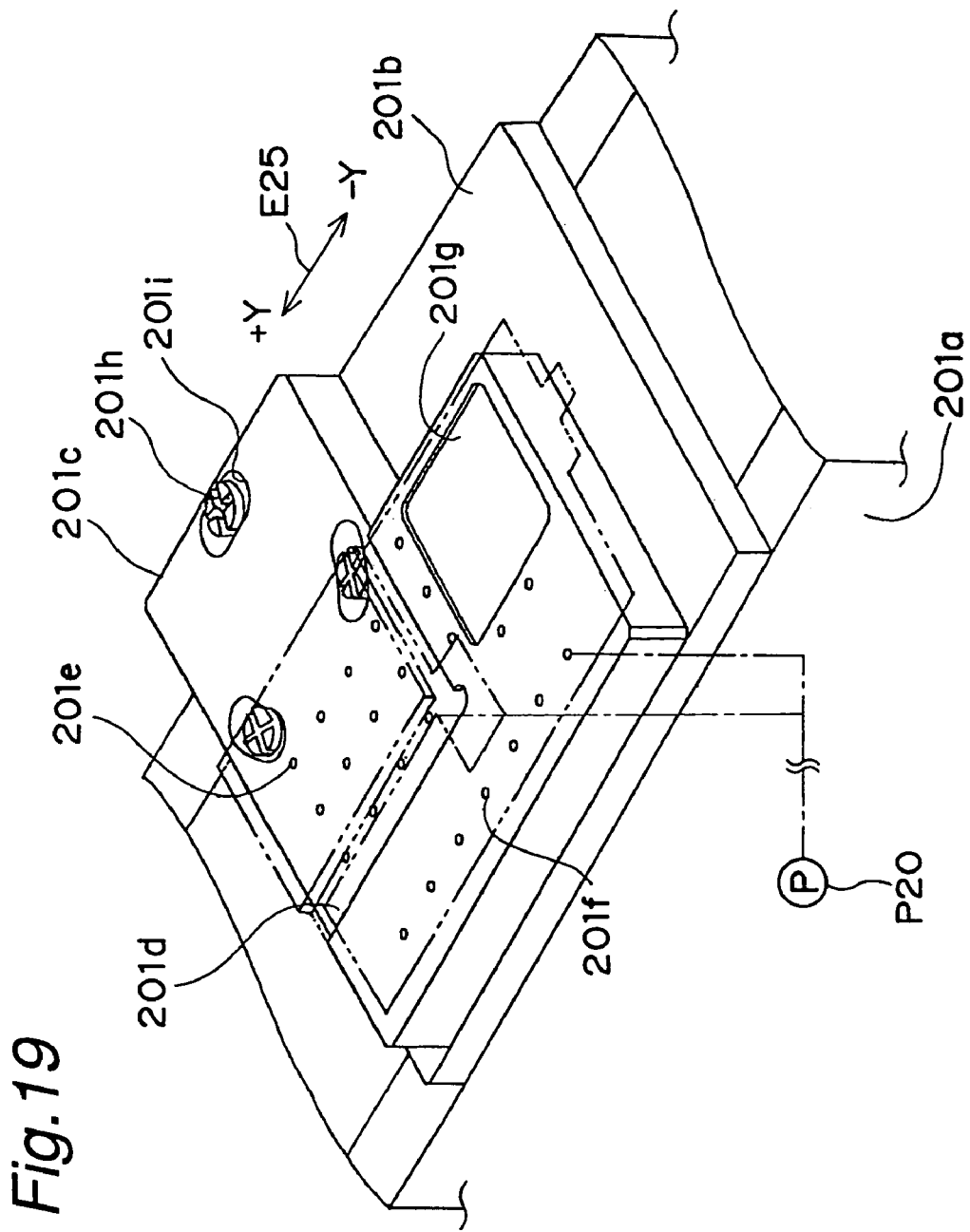
FIG. 19 is a partial perspective view illustrating a carry-out slider of the second mounting apparatus.

As shown in FIG. 19, the carry-out slider 201 has a guide rail 201a and a slide plate 201b driven by an air cylinder S16 to reciprocate linearly on the guide rail 201a in a direction of arrow E25. To the slide plate 201b is fixed a loading plate 201c on which an LCD board 11 and an FPC board 12 are to be loaded. On the loading plate 201c is provided a recess 201d where the LCD board 11 is to be placed. At a bottom of the recess 201*d* is provided a plurality of suction holes 201*e* for sucking the LCD board 11. The suction holes 201*e* are pneumatically connected to a vacuum pump P20. Around the recess 201*d* of the loading plate 201*c* is provided a plurality of suction holes 201*f* for sucking the FPC board 12, and the suction holes 201*f* also are connected to the vacuum pump P20. In an area of the loading plate 201*c* corresponding to the component area 12*j* of the FPC board 12 is provided a recess 201*g* for preventing interference with the IC 4 and the chip components 5. The loading plate 201*c* is fixed to the slide plate 201*b* with three bolts 201*h*. Holes 201*i* into which the bolts 201*h* are inserted have a shape that is not a perfect circle, but rather a distorted ellipse, so that a posture of the loading plate 201*c* can be adjusted with respect to the slide plate 201*b*.

Figure 18:
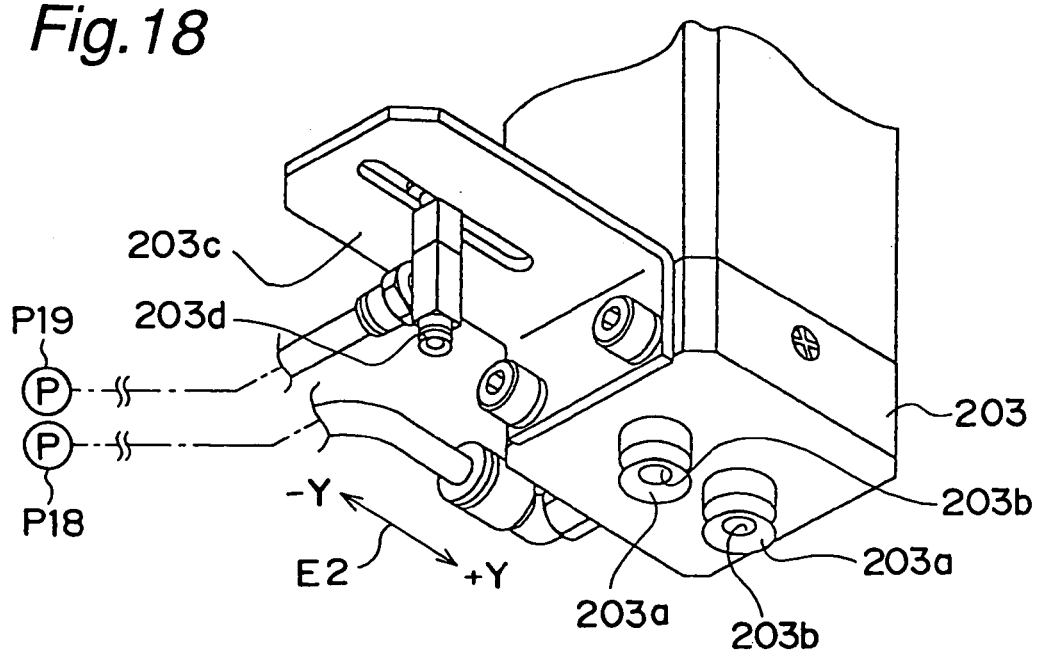
FIG. 18 is a partial perspective view illustrating a carry-out head of the second mounting apparatus.

The carry-out arm 202 is fixed to the slide plate 142*b* to which the carry-in arm 142 is fixed in common. On a distal end of the carry-out arm 102 is provided a carry-out head 203 extending downward. The carry-out head 203 is driven by an air cylinder S15 (see FIG. 4) to move up and down as shown by arrow E26. As shown in FIG. 18, suction holes 203*b* for sucking an LCD board 11 with suction pads 203*a* are provided on a lower end of the carry-out head 203. The suction holes 203*b* are connected to a vacuum pump P18. A nozzle 203*d* for sucking an FPC board 12 is attached to the carry-out head 203 through a bracket 203*c* secured to the carry-out head 203 by screws. The nozzle 203*d* is pneumatically connected to a vacuum pump P19 other than the vacuum pump P18 for sucking an LCD board 11.

Hereinbelow, operations of the component mounting equipment 30 will be described.

First, a process of mounting an FPC board 12 onto an LCD board 11, which is performed by the component mounting equipment 30, will be described in outline with reference to FIGS. 20 to 23.

Figure 20:
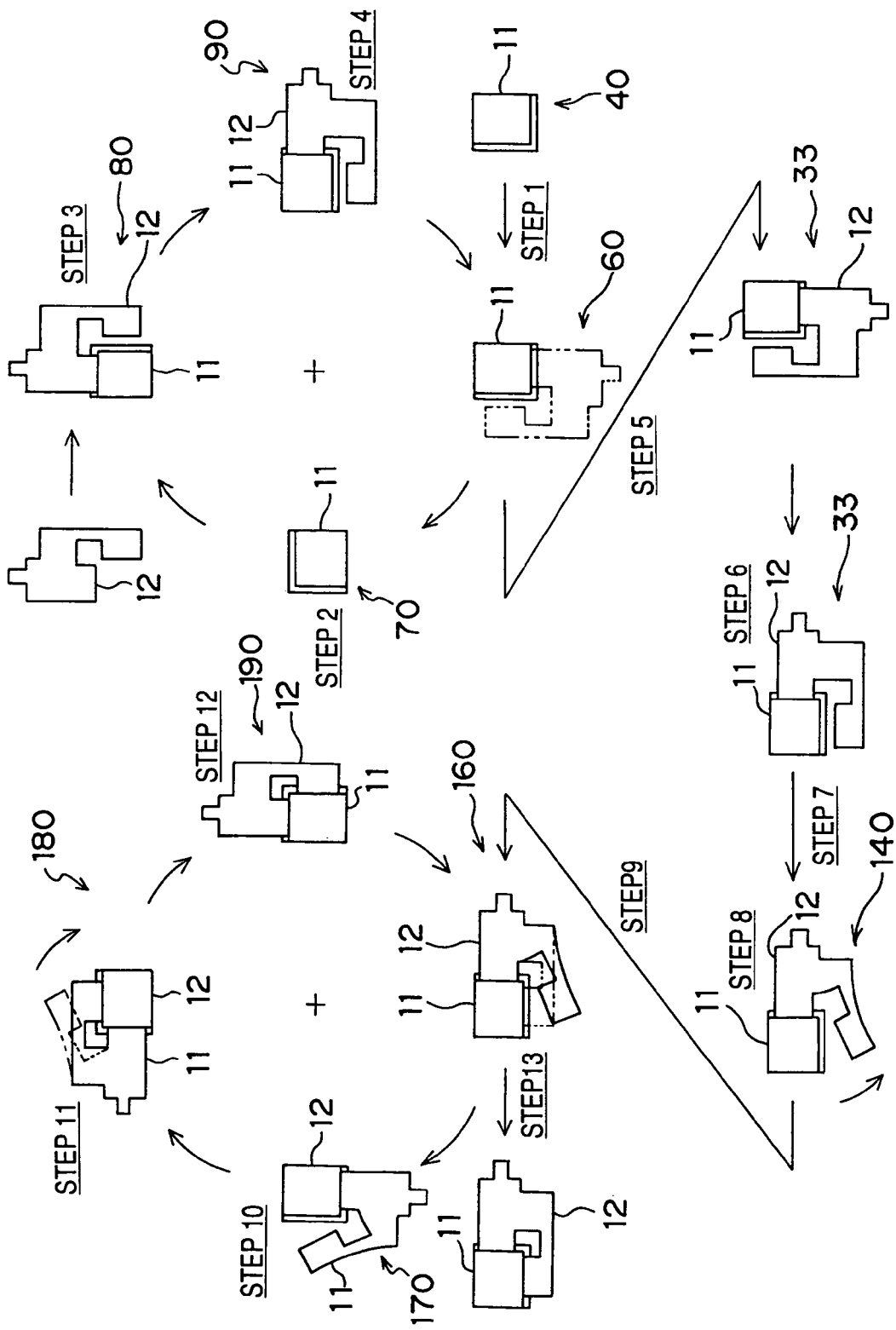
FIG. 20 is a schematic plan view illustrating overall processes of a component mounting method according to the embodiment of the invention.
Figure 21A:
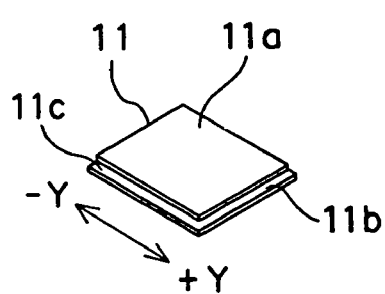
FIGS. 21A to 21D are perspective views for illustrating mounting processes in the first mounting apparatus.
Figure 21B:
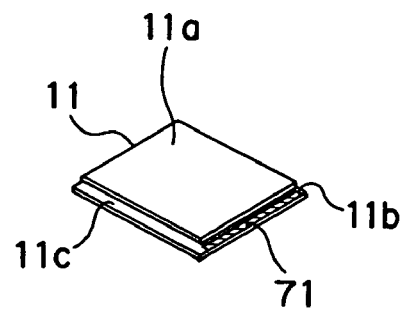
Figure 21C:
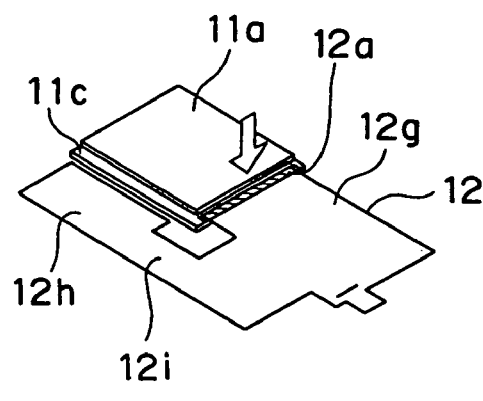
Figure 21D:
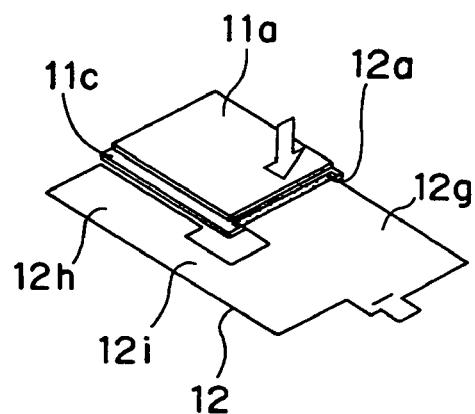
Figure 22A:
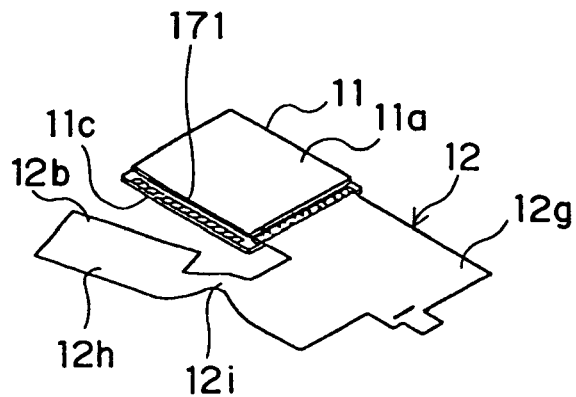
FIGS. 22A to 22D are perspective views for illustrating mounting processes in the second mounting apparatus.
Figure 22B:
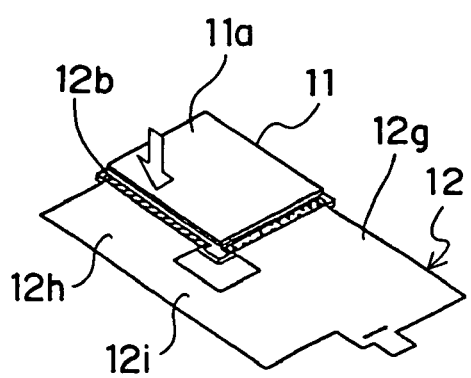
Figure 22C:
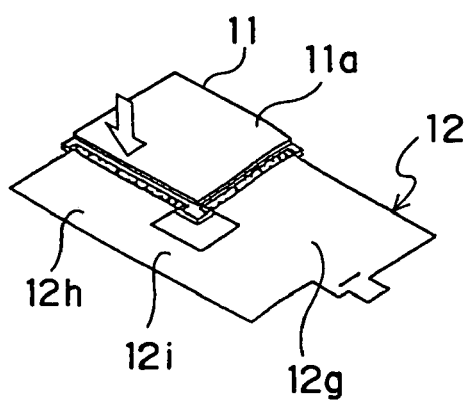
Figure 22D:
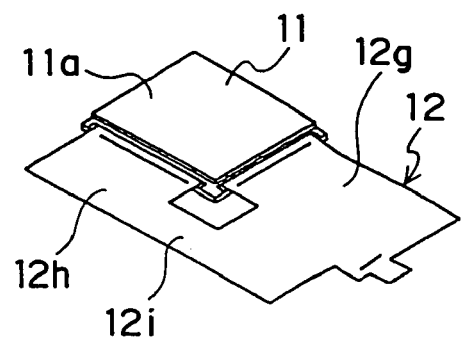

At the hand over section 60 of the first mounting apparatus 31, an LCD board 11 is supplied from the carry-in slider 41 onto one index stage 53 of the rotating transfer section 50 by operation of the carry-in arm 42 (see Step 1 in FIG. 20 and FIG. 21A). Then, after rotation of the index stage 53 by 90 degrees, the ACF tape 71 is applied to the first electrode section 11*b* of the LCD board 11 in the ACF supply section 70 (see Step 2 in FIG. 20 and FIG. 21B). The index stage 53 is then rotated another 90 degrees, an FPC board 12 is supplied from the FPC supply section 110 to the pre-press bonding section 80, and the first section 12*a* of the FPC board 12 is pre-press bonded onto the first electrode section 11*b* of the LCD board 11 (see Step 3 in FIG. 20 and FIG. 21C). The index stage 53 is then rotated another 90 degrees and the first section 12*a* of the FPC board 12 is finally press bonded onto the first electrode section 11*b* of the LCD board 11 in the final press bonding section 90 (see Step 4 in FIG. 20 and FIG. 21D). Further rotation of the index stage 53 by 90 degrees allows the index stage 53 to return to the hand over section 60, and then the LCD board 11 and the FPC board 12 are transferred onto the transporting head 134 of the transporting apparatus 33 (see Step 5 in FIG. 20).

The transporting head 134 is then rotated about the axis L2 so as to turn the LCD board 11 and the FPC board 12 90 degrees counter-clockwise in plan view (see Step 6 in FIG. 20). The LCD board 11 and the FPC board 12 are then supplied from the transporting apparatus 33 to the carry-in section 140 of the second mounting apparatus 32 (see Step 7 in FIG. 20), and a distal end of the movable FPC loading plate 141*j* of the carry-in slider 141 moves away from the LCD loading plate 141*c* so that the plates 141*j* and 141*c* form a shape like a letter V (see Step 8 in FIG. 20 and FIG. 22A). As a result, the link portion 12*i* of the FPC board 12 bends so that the second section 12*b* of the FPC board 12 is separated from the second electrode section 11*c* of the LCD board 11. Accordingly, the second electrode section 11*c* of the LCD board 11 is exposed. The LCD board 11 and the FPC board 12 are subsequently supplied from the carry-in slider 141 onto one index stage 153 of the rotating transfer section 150 by operation of the carry-in arm 142 in the hand over section 160. Even though the boards are supplied to the index stage 153, a shape of the FPC board 12 is maintained so that the second section 12*b* remains separated from the second electrode section 11*c* of the LCD board 11. The index stage 153 is then rotated 90 degrees, and ACF tape 171 is applied to the second electrode section 11*c* of the LCD board 11 in the ACF supply section 170 (see Step 10 in FIG. 20 and FIG. 22A). The index stage 153 is then turned another 90 degrees, and the second section 12*b* of the FPC board 12 is pre-press bonded onto the second electrode section 11*c* of the LCD board 11 in the pre-press bonding section 180 (see Step 11 in FIG. 20 and FIG. 22B). The index stage 153 is then turned another 90 degrees, and the second section 12*b* of the FPC board 12 is finally bonded onto the second electrode section 11*c* of the LCD board 11 in the final press bonding section 190 (see Step 12 in FIG. 20 and FIG. 22C). Eventually, the index stage 153 is turned another 90 degrees and returns to the hand over section 160 (see FIG. 22D), and then the LCD board 11 and the FPC board 12 are transferred onto the carry-out slider 201 by operation of the carry-out arm 202 (see Step 13 in FIG. 20).

In the component mounting equipment 30, as described above, the first mounting apparatus 31 places the first section 12*a* of an FPC board 12 onto the first electrode section 11*b* of an LCD board 11, and then the second mounting apparatus 32 places the second section 12*b* of the FPC board 12 onto the second electrode section 11*c* of the LCD board 11. In the ACF supply section 170 of the second mounting apparatus 32, the second section 12*b* of the FPC board 12 is held so as to be separated from the second electrode section 11*c* of the of the LCD board 11, whereas in the pre-press bonding section 180, the second section 12*b* of the FPC board 12 is released and pre-press bonded onto the second electrode section 11*c* of the LCD board 11.

Operations of the first mounting apparatus 31, the transporting apparatus 33, and the second mounting apparatus 32 will be described in more detail.

First, operation of the first mounting apparatus 31 will be described with reference to FIG. 3 and FIGS. 5 to 12.

An LCD board 11 carried out of a stocker 211 (see FIG. 2) by a conveyor mechanism (not shown) is loaded onto the loading plate 41*c* of the carry-in slider 41 and sucked by the suction holes 41*d*. The loading plate 41*c*, together with the slide plate 41*b*, then moves into the first mounting apparatus 31 and the carry-in arm 42 moves to above the loading plate 41*c*. After the LCD board 11 is recognized by the recognition camera 42*d* and a position of the LCD board 11 is corrected, the carry-in head 43 descends onto the LCD board 11. The LCD board 11 is sucked and held on the carry-in head 43 by the suction holes 43*b*, and suction by the suction holes 41*d* of the loading plate 41*c* is released.

Subsequently, the carry-in arm 42 that has sucked and held the LCD board 11 moves to the hand over section 60. In the hand over section 60, the carry-in arm 42 moves along the guide rail 42*c* to align the LCD board 11 over an index stage 53. The carry-in head 43 then descends so as to load the LCD board 11 into the recess 53*a* of the index stage 53. At this time, the first electrode section 11*b* of the LCD board 11 is aligned with the insertion hole 53*c*. When the LCD board 11 is sucked by the suction holes 53b of the index stage 53, suction by the suction holes 43b of the carry-in head 43 is released.

The rotating shaft 51 then rotates 90 degrees in the direction of arrow B6, thereby moving the index stage 53 to the ACF supply section 70. In the ACF supply section 70, ACF tape 71 is applied to the first electrode section 11b of the LCD board 11. After that, the rotating shaft 51 rotates another 90 degrees in the direction of arrow B6, thereby moving the index stage 53 to the pre-press bonding section 80. In synchronization with movement of the index stage 53 to the pre-press bonding section 80, the FPC supply slider 110a loaded with an FPC board 12 fed from a tray 213 (see FIG. 2) moves to beneath the FPC pre-press bonding head 81. The FPC pre-press bonding head 81 then descends and sucks the FPC board 12 on the FPC supply slider 110a.

The marks 11d and 11f of the LCD board 11 are then recognized by the recognition camera 83h, and the marks 12c and 12d of the FPC board 12 are recognized by the recognition camera 83e. On the basis of this recognition result, the FPC pre-press bonding head 81 moves as shown by arrows B8 and B9 and rotates as shown by arrow B16 to align the first section 12a of the FPC board 12 with the first electrode section 11b of the LCD board 11. After this alignment, the FPC pre-press bonding head 81 descends to put the first section 12a of the FPC board 12 onto the first electrode section 11b of the LCD board 11. On the basis of a result of recognition by the recognition cameras 83e and 83h, the table 83c of the press bonding section 83 moves in directions of arrows B11 and B12 to align the heating-pressurizing tool 83g with the insertion hole 53c of the index stage 53. After that, the heating-pressurizing tool 83g ascends to pinch the first section 12a of the FPC board 12 and the first electrode section 11b of the LCD board 11 between the heating-pressurizing tool 83g and the FPC pre-press bonding head 81, thereby exerting a pressure on the first section 12a and the first electrode section 11b. As a result, the first section 12a of the FPC board 12 is pre-press bonded onto the first electrode section 11b of the LCD board 11 with the ACF tape 71. After completion of this pre-press bonding, suction of the FPC board 12 by the FPC pre-press bonding head 81 is released. In this process, the FPC board 12 may be recognized by the recognition camera 83h and the LCD board 11 may be recognized by the recognition camera 83e. Otherwise, both the LCD board 11 and the FPC board 12 may be recognized by either one of the recognition cameras 83e and 83h.

As shown in FIG. 8, a depth α1 of the recess 53a of the index stage 53 is set so that a clearance α2 larger than a thickness of the FPC board 12 is provided between the index stage 53 and the second portion 81b of the FPC pre-press bonding head 81 when the first portion 81a of the FPC pre-press bonding head 81 is pressing the first section 12a of the FPC board 12 onto the first electrode section 11b of the LCD board 11. With this arrangement, interference between the FPC pre-press bonding head 81 and the index stage 53 is prevented when the first section 12a of the FPC board 12 is pressed onto the first electrode section 11b of the LCD board 11, resulting in that the first section 12a is reliably pressed onto the first electrode section 11b.

Subsequently, the rotating shaft 51 rotates another 90 degrees to move the index stage 53 to the final press bonding section 90. In the final press bonding section 90, the first section 12a of the FPC board 12 is pressed onto the first electrode section 11b of the LCD board 11 with a pressure larger than that in the pre-press bonding section 80. As a result, the first section 12a is fixed to the first electrode section 11b. Further, the driver voltage supply lines 17a in the first electrode section 11b are electrically connected to corresponding driver voltage supply lines 21a in the first section 12a.

The rotating shaft 51 then rotates another 90 degrees and the index stage 53 returns to the hand over section 60. In synchronization with this movement, the carry-out arm 102 moves to the hand over section 60. Then, the carry-out head 103 descends onto the index stage 53, and the suction holes 103c and 103d of the carry-out head 103 suck the LCD board 11 and the FPC board 12. When the carry-out head 103 sucks the LCD board 11 and the FPC board 12, suction by the index stage 53 is released. After the carry-out head 103 that has sucked the LCD board 11 and the FPC board 12 ascends, the carry-out arm 102 moves to above the loading plate 101c of the carry-out slider 101. The carry-out head 103 then descends again, and the LCD board 11 and the FPC board 12 are loaded onto the loading plate 101c and sucked by the suction holes 101e. Synchronously, suction by the carry-out head 103 is released. The loading plate 101c then moves together with the slide plate 101b to carry out the LCD board 11 and the FPC board 12 from the first mounting apparatus 31 to the transporting apparatus 33.

Operation of the transporting apparatus 33 will be described below. On the basis of a recognition result obtained by the recognition camera 135, the transporting head 134 moves along the guide rail 133b and is aligned with the FPC board 12 and LCD board 11 on the loading plate 101c of the carry-out slider 101 of the first mounting apparatus 31. The transporting head 134 then descends and sucks the FPC board 12 and the LCD board 11, and suction by the loading plate 101c is released. Subsequently, the transporting head 134 ascends and moves to the carry-in section 140 of the second mounting apparatus 32 together with the slide plate 133b. The LCD board 11 and the FPC board 12 may be conveyed from the first mounting apparatus 31 to the second mounting apparatus 32 by manual operation or other conveying apparatus without provision of the transporting apparatus 33.

Hereinbelow, operation of the second mounting apparatus 32 will be described with reference to FIG. 4 and FIGS. 13 to 19.

Figure 23A:
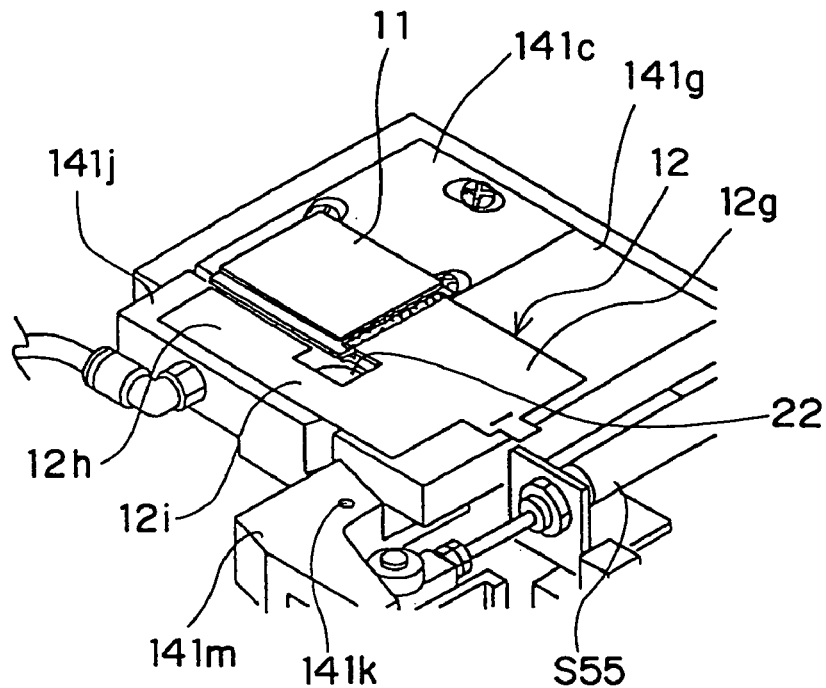
FIGS. 23A and 23B are perspective views for illustrating an operation of the carry-in slider of the second mounting apparatus.

Initially, after moving to above the carry-in slider 141, the transporting head 134 of the transporting apparatus 33 descends. By this descent, the LCD board 11, the first portion 12g of the FPC board 12, and the second portion 12h of the FPC board 12 are respectively loaded onto the LCD loading plate 141c, the fixed FPC loading plate 141g, and the movable FPC loading plate 141j of the carry-in slider 141. Then, the LCD board 11 is sucked by the suction holes 141d and the FPC board 12 is sucked by the suction holes 141h and 141n, whereas suction by the transporting head 34 is released. At this stage, as shown in FIG. 23A, the movable FPC loading plate 141j is in intimate contact with the LCD loading plate 141c.

Figure 23B:
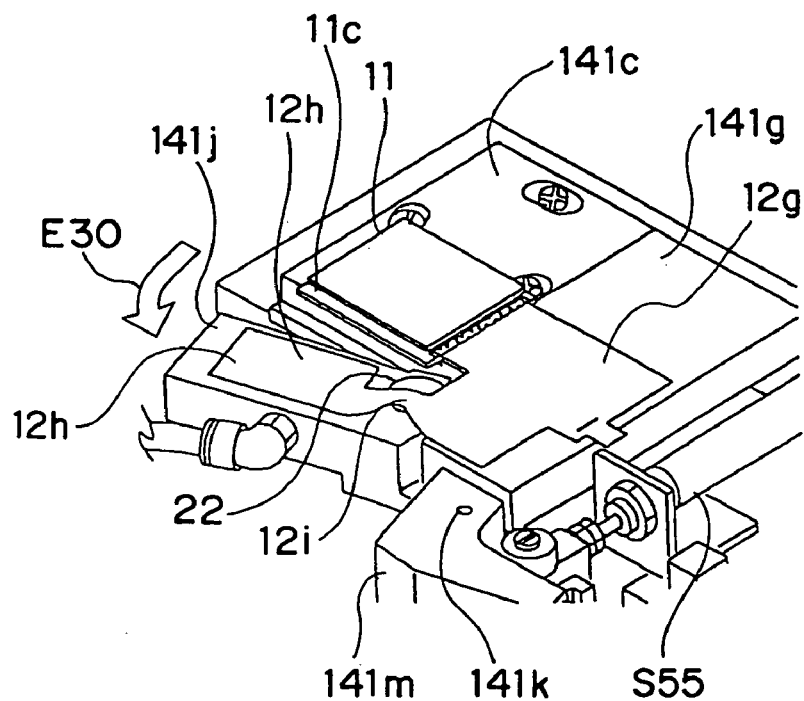

Then, the LCD loading plate 141c, the fixed FPC loading plate 141g, and the movable FPC loading plate 141j, together with the slide plate 141b, move into the second mounting apparatus 32. After that, as shown by arrow E30, the movable FPC loading plate 141j driven by the air cylinder S55 pivots in a horizontal plane with respect to the LCD loading plate 141c. As a result, as shown in FIG. 23B, a distal end of the movable FPC loading plate 141j moves away from the LCD loading plate 141c so that the movable FPC loading plate 141j and the LCD loading plate 141c form a shape like a letter V in plan view. As described above, the LCD board 11 and the first portion 12g of the FPC board 12 are respectively sucked and held on the LCD loading plate 141c and the fixed FPC loading plate 141g, and the second portion 12h of the FPC board 12 is sucked and held on the movable FPC loading plate 141j. Accordingly, formation of the shape like the letter V by the movable FPC loading plate 141j and the LCD loading plate 141c causes the link portion 12i of the FPC board 12 to bend the second portion 12h of the FPC board 12 so that it is separated from the second electrode section 11c of the LCD board 11. That is, pivots of the movable FPC loading plate 141j cases exposure of the second electrode section 11c of the LCD board 11.

In the FPC board 12, as described above, the cut-out hole 22 decreasing the width D1 of the link portion 12i is provided so that the FPC board 12 bends easily. Therefore, when the movable FPC loading plate 141j pivots, the second portion 12h of the FPC board 12 is reliably separated from the second electrode section 11c of the LCD board 11 so as to expose the second electrode section 11c of the LCD board 11.

Subsequently, the carry-in arm 142 moves to above the carry-in slider 141. After recognition of the LCD board 11 by the recognition camera 142d and correction of a position of the LCD board 11 on the basis of the recognition, the carry-in head 143 descends onto the LCD board 11 and the FPC board 12. Then, the LCD board 11 is sucked by the suction holes 143b and the FPC board 12 is sucked by the suction holes 143c and 143d, whereas suction by the suction holes 141d, 141h, and 141n on a side of the carry-in slider 141 is released. As a result, the LCD board 11 and the FPC board 12 are held by the carry-in head 143. In this state, the FPC board 12 still retains its shape such that the second portion 12h is separated from the second electrode section 11c of the LCD board 11 (its shape that causes the second electrode section 11c of the of the LCD board 11 to be exposed).

Next, the carry-in arm 142 that has sucked and held the LCD board 11 and the FPC board 12 moves to the hand over section 160. In the hand over section 160, the carry-in head 143 moves along the guide rail 142c to align the LCD board 11 over an index stage 153. The carry-in head 143 then descends to load the LCD board 11 and the FPC board 12 onto the index stage 53. At this time, the second electrode section 11c of the LCD board 11 is positioned in the insertion hole 153e. The LCD board 11, the first portion 12g of the FPC board 12, and the second portion 12h of the FPC board 12 are respectively sucked by the suction holes 153b, 153c, and 153d of the index stage 153. Further, suction by the suction holes 143b, 143c, and 143d of the carry-in head 143 is released. As a result, the LCD board 11 and the FPC board 12 are held on the index stage 153. Even in this state, the FPC board 12 still retains its shape such that the second portion 12h is separated from the second electrode section 11c of the LCD board 11.

Then, the rotatable shaft 151 rotates 90 degrees in the direction of arrow E5, thereby moving the index stage 153 to the ACF supply section 170. In the ACF supply section 170, ACF tape 171 is applied to the second electrode section 11c of the LCD board 11. As described above, the FPC board 12 on the index stage 153 has a shape such that the second portion 12h is separated from the second electrode section 11c of the LCD board 11, and therefore the ACF tape 171 can be applied reliably and smoothly onto the second electrode section 11c.

The rotatable shaft 151 then rotates another 90 degrees in the direction of arrow E5, thereby moving the index stage 153 to the pre-press bonding section 180. In the pre-press bonding section 180, the recognition camera 183g recognizes a position and a posture of the second electrode section 11c of the LCD board 11 by the marks 11e and 11f, and the recognition camera 183e recognizes a position and a posture of the FPC board 12 by the marks 12e and 12f.

Figure 24A:
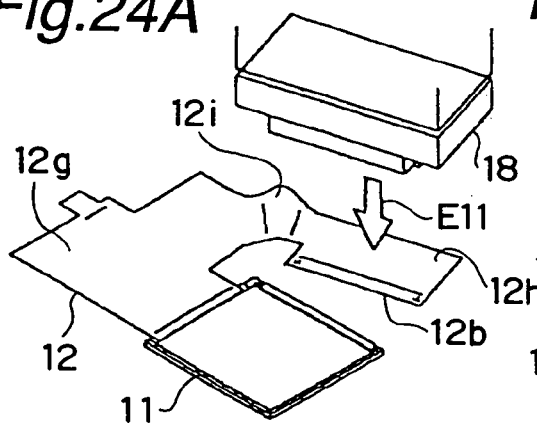
FIGS. 24A to 24E are perspective views for illustrating an alignment of an FPC board with an LCD board by a pre-press bonding head of the second mounting apparatus.

As shown in FIG. 24A, according to the basis of this recognition result, the FPC pre-press bonding head 181 descends onto the second portion 12h of the FPC board 12. The second portion 12h of the FPC board 12 is then sucked by the suction holes 181a of the FPC pre-press bonding head 181, and suction of the second portion 12h by the suction holes 153d of the index stage 153 is released. As a result, the second portion 12h of the FPC board 12 including the second section 12b is sucked by the FPC pre-press bonding head 181, while the LCD board 11 and the first portion 12g of the FPC board 12 remain being sucked by the index stage 153.

Figure 24B:
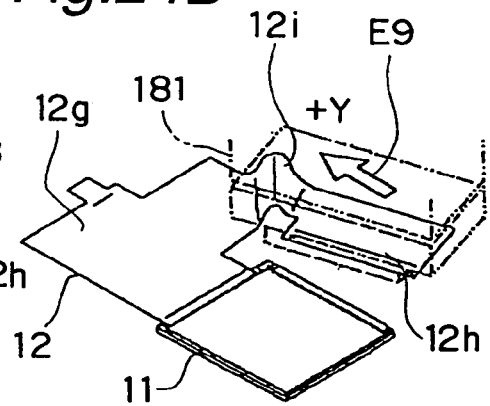
Figure 24C:
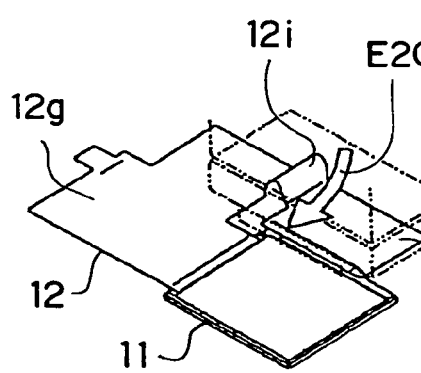

Subsequently, on the basis of the recognition result, the FPC pre-press bonding head 181 moves so as to align the second section 12b of the FPC board 12 with the second electrode section 11c of the LCD board 11. As shown in FIG. 24B, the FPC pre-press bonding head 181 initially moves in the direction shown by arrow E9 (+Y direction). The FPC pre-press bonding head 181 then rotates about the axis L5 (see FIG. 17) as shown in FIG. 24C (arrow E20). When this rotation is finished, the second section 12b of the FPC board 12 and the second electrode section 11c of the LCD board 11 are parallel to each other. Movement in the direction of arrow E9 shown in FIG. 24B is made for a purpose of increasing deflection of the link portion 12i of the FPC board 12, and thereby reducing a resistance caused by deformation of the FPC board 12 during rotation of the FPC pre-press bonding head 181.

Figure 24D:
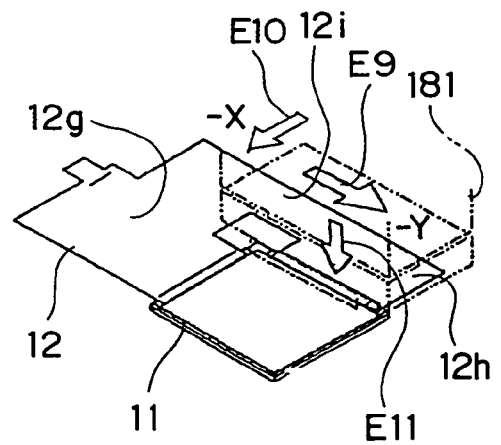

As shown in FIG. 24D, the FPC pre-press bonding head 181 then moves in the direction of arrow E10 (−X direction) and in the direction of arrow E9 (−Y direction). When movement in the directions of arrows E9 and E10 is finished, the second section 12b of the FPC board 12 has been aligned with the second electrode section 11c of the LCD board 11. The FPC pre-press bonding head 181 then descends as shown by arrow E11 in FIG. 24D to put the second section 12b of the FPC board 12 onto the second electrode section 11c of the LCD board 11.

A quantity of movement of the FPC pre-press bonding head 181 in the directions of arrows E9, E10, and E20 is calculated by the controller 34 (see FIG. 2) on the basis of a position of the second section 12b of the FPC board 12 and a position of the second electrode section 11c of the LCD board 11 as recognized by the recognition cameras 183e and 183g. The controller 34 moves the FPC pre-press bonding head 181 on the basis of a result of this calculation.

Figure 24E:
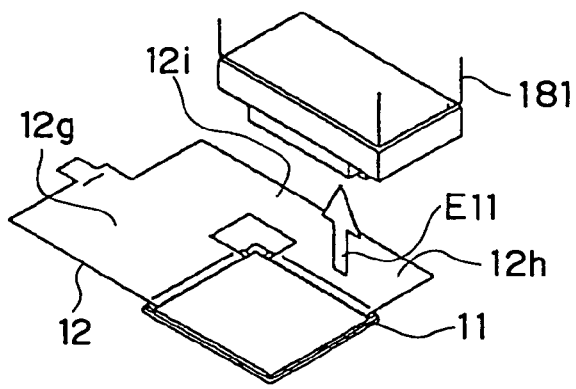

On the basis of a result of recognition by the recognition cameras 183e and 183g, the table 183c of the press bonding section 183 then moves in the directions of arrows E6 and E7 to align the heating-pressurizing tool 183d with the insertion hole 153e of the index stage 153. After that, the heating-pressurizing tool 183g ascends to pinch the second section 12b of the FPC board 12 and the second electrode section 11c of the LCD board 11 between the heating-pressuring tool 183g and the FPC pre-press bonding head 181, thereby exerting a pressure on these sections. As a result, the second section 12b of the FPC board 12 is pre-press bonded onto the second electrode section 11c of the LCD board 11 with the ACF tape 171. After completion of this pre-press bonding, suction of the FPC board 12 by the FPC pre-press bonding head 181 is released. After that, the FPC pre-press bonding head 181 ascends as shown in FIG. 24E. In the above process, the FPC board 12 may be recognized by the recognition camera 183g and the LCD board 11 may be recognized by the recognition camera 183e. Otherwise, both the LCD board 11 and the FPC board 12 may be recognized by either one of the recognition cameras 183e and 183g.

The rotatable shaft 151 then rotates another 90 degrees, thereby moving the index stage 153 to the final press bonding section 190. In the final press bonding section 190, the second section 12b of the FPC board 12 is pressed onto the second electrode section 11c of the LCD board 11 with a pressure larger than that in the pre-press bonding section 180. As a result, the second section 12b is fixed to the second electrode section 11c. Further, driver voltage supply lines 21b in the second section 12b are electrically connected to corresponding driver voltage supply lines 17b in the second electrode section 11c.

The rotatable shaft 151 then turns another 90 degrees, thereby returning the index stage 153 to the hand over section 160. In synchronization with this movement, the carry-out arm 202 moves to the hand over section 160. Then, the carry-out head 203 descends onto the index stage 153, and the suction holes 203b and the nozzle 203d of the carry-out head 203 respectively suck the LCD board 11 and the FPC board 12. When the carry-out head 203 sucks the LCD board 11 and the FPC board 12, suction by the index stage 153 is released. After the carry-out head 203 that has sucked the LCD board 11 and the FPC board 12 ascends, the carry-out arm 202 moves to above the loading plate 201c of the carry-out slider 201. The carry-out head 203 then descends again to load the LCD board 11 and the FPC board 12 onto the loading plate 201c, and the LCD board 11 and the FPC board 12 are sucked by the suction holes 201e and 201f. In synchronization with these operations, suction by the carry-out head 203 is released. After that, the loading plate 201c moves together with the slide plate 201b to carry out the LCD board 11 and the FPC board 12 to a stocker 212 outside the second mounting apparatus 32 (see FIG. 2).

FIGS. 25 to 29 illustrate other examples of the carry-in slider 141 of the second mounting apparatus 32.

Figure 25:
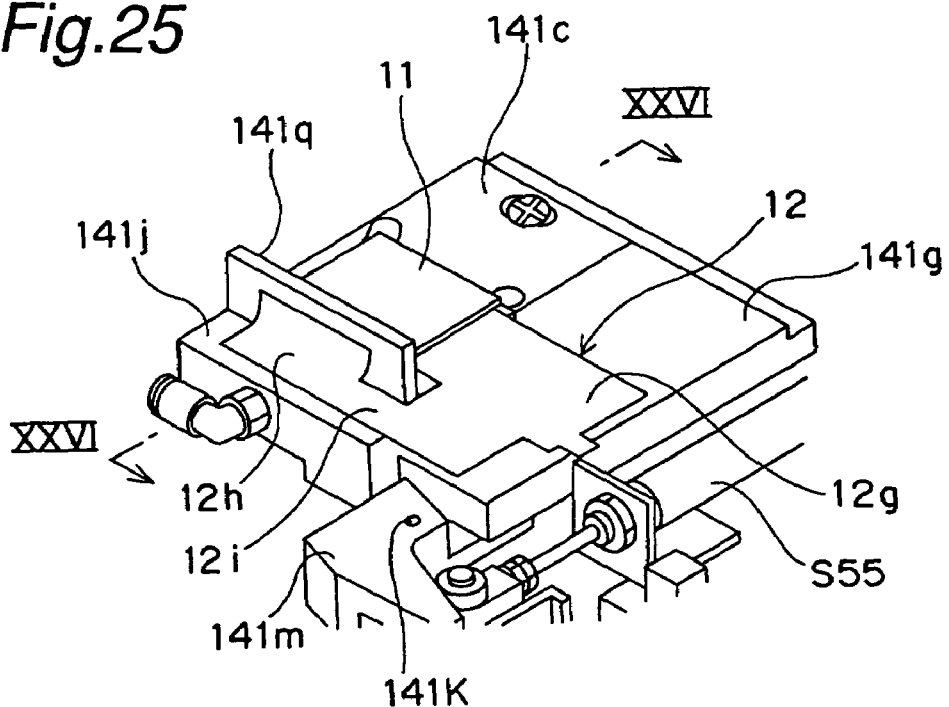
FIG. 25 is a perspective view illustrating another example of a carry-in slider provided in the second mounting apparatus.
Figure 26:
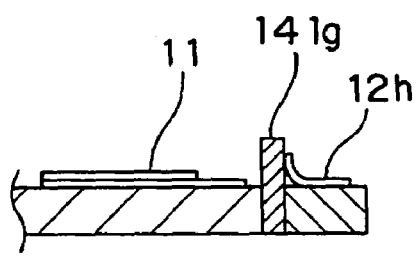
FIG. 26 is a schematic partial sectional view taken along line XXVI—XXVI in FIG. 25.

In an example shown in FIGS. 25 and 26, to an end surface of a movable FPC loading plate 141j facing an LCD loading plate 141c is fixed a bending plate 141q having a distal end protruding from surfaces of the movable FPC loading plate 141j and the LCD loading plate 141c on which an FPC board 12 and an LCD board are to be loaded (upper surfaces in FIG. 25). In this example, when an LCD board 11 and an FPC board 12 are supplied from the transporting head 34 of the transporting apparatus 33, a distal end of the movable FPC loading plate 141j moves away from the LCD loading plate 141c so that the movable FPC loading plate 141j and the LCD loading plate 141c form a shape like a letter V. However, before arrival at the hand over section 160, the plates 141j and 141c are closed as shown in FIG. 25. As a result, a second portion 12h of the FPC board 12 is bent upward by the bending plate 141q, so that the second electrode section 11c of the LCD board 11 is exposed. The bending plate 141q may be constructed integrally with the movable FPC loading plate 141j.

Figure 27:
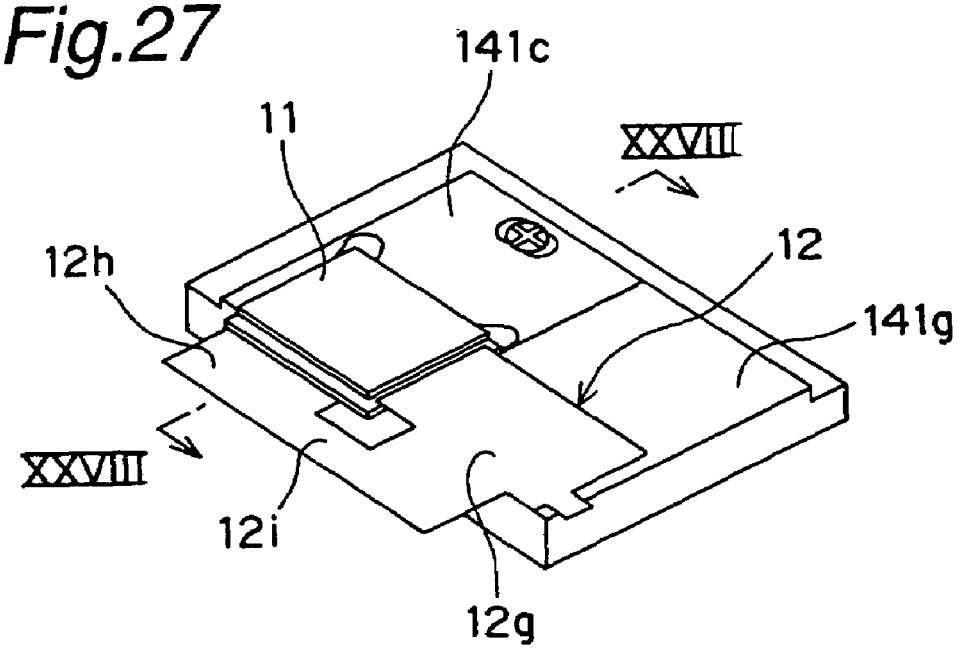
FIG. 27 is a perspective view illustrating another example of a carry-in slider provided in the second mounting apparatus.
Figure 28:
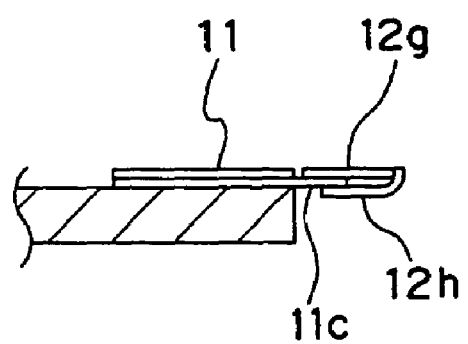
FIG. 28 is a partial sectional view taken along line XXVIII—XXVIII in FIG. 27.

In an example shown in FIGS. 27 and 28, the movable FPC loading plate is not provided and a second portion 12h (a second section 12b) of an FPC board 12 is arranged on a lower surface side of an LCD board 11 in these figures so that a second electrode section 11c of the LCD board 11 is exposed.

Figure 29:
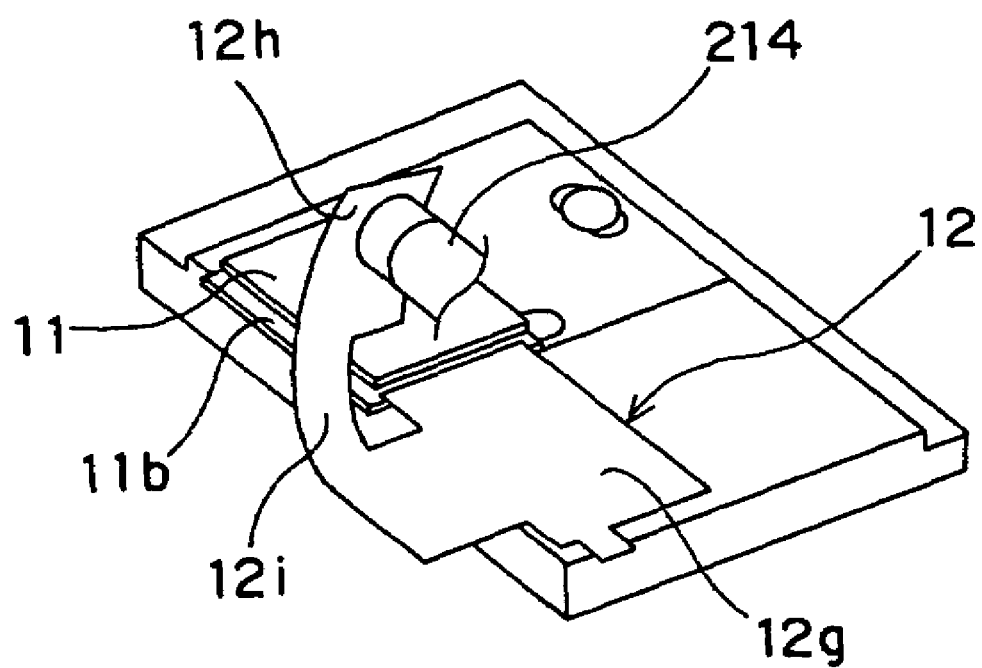
FIG. 29 is a perspective view illustrating another example of a carry-in slider provided in the second mounting apparatus.
Figure 30A:
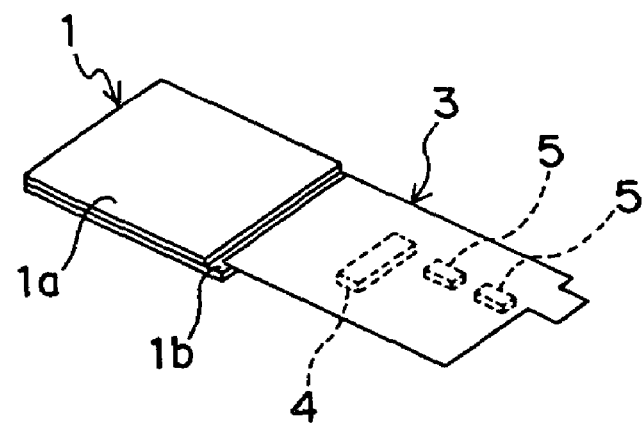
FIG. 30A is a perspective view illustrating a conventional electronic component composed of a LCD board and a conventional FPC board.
Figure 30B:
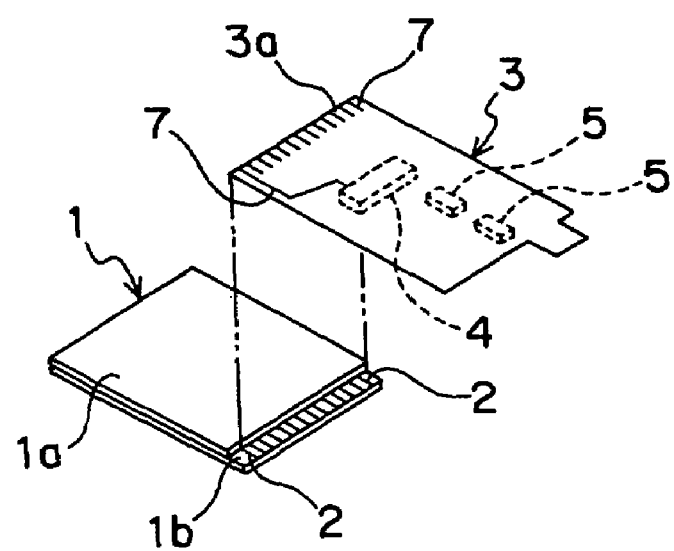
FIG. 30B is an exploded perspective view illustrating the conventional electronic component.

In an example shown in FIG. 29, a second portion 12h of an FPC board 12 is sucked by a suction nozzle 214 that moves with a slide plate 141b, so that a second electrode section 11c of an LCD board 11 is exposed.

The invention is not limited to the above embodiments, and various modifications may be made therein.

For example, the component mounting equipment and method of the invention may be employed for mounting film-like components other than FPC boards (e.g., tape carrier packages (TCP)) onto plate-like components other than LCD boards (e.g., electroluminescence devices (EL devices), plasma display panels (PDP), or conventional printed circuit boards). Shapes and pitches of the suction holes in the carry-in slider and the like of the first and second mounting apparatuses are not limited to those shown in the drawings and may be set appropriately in accordance with sizes and shapes of an LCD board and an FPC board. The first and second mounting apparatuses may adopt carry-in sliders and the like which mechanically hold an LCD board and an FPC board instead of sucking these boards. For the ACF supply sections of the first and second mounting apparatuses may be substituted ACP supply sections for supplying ACP onto electrode sections of an LCD board.

Although the present invention has been fully described by way of the examples with reference to the accompanying drawings, it is to be noted here that various changes and modifications will be apparent to those who skilled in the art. Therefore, unless such changes and modifications otherwise depart from the spirit and scope of the present invention, they should be construed as being therein.

The invention claimed is:

1. Equipment for mounting a film-like component onto a plate-like component, the plate-like component having a first placement section on one side edge thereof and a second placement section on another side edge thereof, and the film-like component having a first section on one side edge thereof and a second section on another side edge thereof, said equipment comprising:

a first mounting apparatus for placing the first section of the film-like component onto the first placement section of the plate-like component, said first mounting apparatus including
(i) a first adhesive supply section for supplying adhesive to the first placement section of the plate-like component,
(ii) a first pre-press bonding section for aligning the first section of the film-like component with the first placement section of the plate-like component, and pressing the first section onto the first placement section with a first pressing force,
(iii) a first final-press bonding section for pressing the first section of the film-like component against the first placement section of the plate-like component with a second pressing force, and for thereby fixing the first section of the film-like component onto the first placement section of the plate-like component,
(iv) a first transfer section for holding the plate-like component, and transferring the plate-like component sequentially to said first adhesive supply section, said first pre-press bonding section, and said first final-press bonding section, and
(v) a film-like component supply section for supplying the film-like component to said first pre-press bonding section; and a second mounting apparatus for placing the second section of the film-like component onto the second placement section of the plate-like component.

2. The equipment according to claim 1, wherein
said first transfer section comprises index stages, each of said index stages having a recess within which the plate-like component is to be loaded, and
said first pre-press bonding section comprises a first pre-press bonding head having a first portion for holding a portion of the film-like component including the first section and a second portion for holding a portion of the film-like component including the second section, with said first portion of said first pre-press bonding head being for pressing the first section of the film-like component onto the first placement section of the plate-like component when the plate-like component is loaded into said recess of one of said index stages,
with a depth of said recess being such that a clearance larger than a thickness of the film-like component is provided between said one of said index stages and said second portion of said first pre-press bonding head when said first portion of said first pre-press bonding head is pressing the first section of the film-like component onto the first placement section of the plate-like component.

3. The equipment according to claim 1, wherein
said second mounting apparatus includes
   (i) a second adhesive supply section for supplying adhesive to the second placement section of the plate-like component,
   (ii) a second pre-press bonding section for aligning the second section of the film-like component with the second placement section of the plate-like component, and pressing the second section onto the second placement section with a third pressing force,
   (iii) a second final-press bonding section for pressing the second section of the film-like component against the second placement section of the plate-like component with a fourth pressing force, and for thereby fixing the second section of the film-like component onto the second placement section of the plate-like component, and
   (iv) a second transfer section for transferring the plate-like component and the film-like component, with the first section fixed to the first placement section, sequentially to said second adhesive supply section, said second pre-press bonding section, and said second final-press bonding section, said second transfer section including
      (a) a first holding mechanism for holding the plate-like component,
      (b) a second holding mechanism for holding a portion of the film-like component including the first section, and
      (c) a third holding mechanism for holding a portion of the film-like component including the second section such that the second section is separated from the second placement section of the plate-like component when in said second adhesive supply section, and for releasing the portion of the film-like component including the second section when in said second pre-press bonding section.

4. The equipment according to claim 1, further comprising:
a transporting apparatus, interconnecting said first mounting apparatus and said second mounting apparatus, for transporting from said first mounting apparatus to said second mounting apparatus the plate-like component and the film-like component, with the first section fixed to the first placement section.

5. The equipment according to claim 1, wherein
the plate-like component is a liquid crystal display board, and
the film-like component is a flexible printed-circuit board on which a driver circuit for the liquid crystal display board is provided.

6. The equipment according to claim 1, wherein
said second pre-press bonding section includes
   (i) a recognition section for recognizing the plate-like component and the film-like component, and
   (ii) an alignment head for holding the second section of the film-like component and moving the second section of the film-like component based on recognition performed by said recognition section, for thereby aligning the second section with the second placement section of the plate-like component.

7. The equipment according to claim 1, wherein
said second mounting apparatus further includes a carry-in section for deforming the film-like component into a deformed state such that the second section is separated from the second placement section, and for supplying to said second transfer section the plate-like component and the film-like component, with the film-like component in the deformed state and with the first section fixed to the first placement section.

8. The equipment according to claim 2, wherein
said second mounting apparatus includes
   (i) a second adhesive supply section for supplying adhesive to the second placement section of the plate-like component,
   (ii) a second pre-press bonding section for aligning the second section of the film-like component with the second placement section of the plate-like component, and pressing the second section onto the second placement section with a third pressing force,
   (iii) a second final-press bonding section for pressing the second section of the film-like component against the second placement section of the plate-like component with a fourth pressing force, and for thereby fixing the second section of the film-like component onto the second placement section of the plate-like component, and
   (iv) a second transfer section for transferring the plate-like component and the film-like component, with the first section fixed to the first placement section, sequentially to said second adhesive supply section, said second pre-press bonding section, and said second final-press bonding section, said second transfer section including
      (a) a first holding mechanism for holding the plate-like component,
      (b) a second holding mechanism for holding the portion of the film-like component including the first section, and
      (c) a third holding mechanism for holding the portion of the film-like component including the second section such that the second section is separated from the second placement section of the plate-like component when in said second adhesive supply section, and for releasing the portion of the film-like component including the second section when in said second pre-press bonding section.

9. The equipment according to claim 3, wherein
said second pre-press bonding section includes
(i) a recognition section for recognizing the plate-like component and the film-like component, and
(ii) an alignment head for holding the second section of the film-like component and moving the second section of the film-like component based on recognition performed by said recognition section, for thereby aligning the second section with the second placement section of the plate-like component.

10. The equipment according to claim 3, wherein
said second mounting apparatus further includes a carry-in section for deforming the film-like component into a deformed state such that the second section is separated from the second placement section, and for supplying to said second transfer section the plate-like component and the film-like component, with the film-like component in the deformed state and with the first section fixed to the first placement section.

11. The equipment according to claim 8, wherein
said second pre-press bonding section includes
(i) a recognition section for recognizing the plate-like component and the film-like component, and
(ii) an alignment head for holding the second section of the film-like component and moving the second section of the film-like component based on recognition performed by said recognition section, for thereby aligning the second section with the second placement section of the plate-like component.

12. The equipment according to claim 11, wherein
said second mounting apparatus further includes a carry-in section for deforming the film-like component into a deformed state such that the second section is separated from the second placement section, and for supplying to said second transfer section the plate-like component and the film-like component, with the film-like component in the deformed state and with the first section fixed to the first placement section.

13. The equipment according to claim 12, further comprising:
a transporting apparatus, interconnecting said first mounting apparatus and said second mounting apparatus, for transporting from said first mounting apparatus to said second mounting apparatus the plate-like component and the film-like component, with the first section fixed to the first placement section.

14. The equipment according to claim 13, wherein
the plate-like component is a liquid crystal display board, and
the film-like component is a flexible printed-circuit board on which a driver circuit for the liquid crystal display board is provided.

15. An apparatus for mounting a film-like component onto a plate-like component, the plate-like component having a first placement section on one side edge thereof and a second placement section on another side edge thereof, and the film-like component having a first section on one side edge thereof and a second section on another side edge thereof, said apparatus comprising:
an adhesive supply section for supplying adhesive to the first placement section of the plate-like component;
a pre-press bonding section for aligning the first section of the film-like component with the first placement section of the plate-like component, and pressing the first section onto the first placement section with a first pressing force;
a final-press bonding section for pressing the first section of the film-like component against the first placement section of the plate-like component with a second pressing force, and for thereby fixing the first section of the film-like component onto the first placement section of the plate-like component;
a transfer section for holding the plate-like component, and transferring the plate-like component sequentially to said adhesive supply section, said pre-press bonding section, and said final-press bonding section; and
a film-like component supply section for supplying the film-like component to said pre-press bonding section.

16. The apparatus according to claim 15, wherein
said transfer section comprises index stages, each of said index stages having a recess within which the plate-like component is to be loaded, and
said pre-press bonding section comprises a pre-press bonding head having a first portion for holding a portion of the film-like component including the first section and a second portion for holding a portion of the film-like component including the second section, with said first portion of said pre-press bonding head being for pressing the first section of the film-like component onto the first placement section of the plate-like component when the plate-like component is loaded into said recess of one of said index stages,
with a depth of said recess being such that a clearance larger than a thickness of the film-like component is provided between said one of said index stages and said second portion of said pre-press bonding head when said first portion of said pre-press bonding head is pressing the first section of the film-like component onto the first placement section of the plate-like component.

17. An apparatus for mounting a film-like component onto a plate-like component, the plate-like component having a first placement section on one side edge thereof and a second placement section on another side edge thereof, and the film-like component having a first section on one side edge thereof and a second section on another side edge thereof, said apparatus comprising:
an adhesive supply section for supplying adhesive to the second placement section of the plate-like component;
a pre-press bonding section for aligning the second section of the film-like component with the second placement section of the plate-like component, and pressing the second section onto the second placement section with a first pressing force;
a final-press bonding section for pressing the second section of the film-like component against the second placement section of the plate-like component with a second pressing force, and for thereby fixing the second section of the film-like component onto the second placement section of the plate-like component; and
a transfer section for transferring the plate-like component and the film-like component, with the first section fixed to the first placement section, sequentially to said adhesive supply section, said pre-press bonding section, and said final-press bonding section, said transfer section including
(i) a first holding mechanism for holding the plate-like component,
(ii) a second holding mechanism for holding a portion of the film-like component including the first section, and (iii) a third holding mechanism for holding a portion of the film-like component including the second section such that the second section is separated from the second placement section of the plate-like component when in said adhesive supply section, and for releasing the portion of the film-like component including the second section when in said pre-press bonding section.

18. The apparatus according to claim 17, wherein said pre-press bonding section includes
   (i) a recognition section for recognizing the plate-like component and the film-like component, and
   (ii) an alignment head for holding the second section of the film-like component and moving the second section of the film-like component based on recognition performed by said recognition section, for thereby aligning the second section with the second placement section of the plate-like component.

19. The apparatus according to claim 17, further comprising:
   a carry-in section for deforming the film-like component into a deformed state such that the second section is separated from the second placement section, and for supplying to said transfer section the plate-like component and the film-like component, with the film-like component in the deformed state and with the first section fixed to the first placement section.

20. The apparatus according to claim 18, further comprising:
   a carry-in section for deforming the film-like component into a deformed state such that the second section is separated from the second placement section, and for supplying to said transfer section the plate-like component and the film-like component, with the film-like component in the deformed state and with the first section fixed to the first placement section.

* * * * *